United States Patent
Kawase et al.

(10) Patent No.: US 7,008,282 B2
(45) Date of Patent: Mar. 7, 2006

(54) METHOD FOR ELIMINATING MATERIALS, METHOD FOR RECLAIMING BASE, METHOD FOR MANUFACTURING DISPLAY, AND ELECTRONIC APPLIANCES COMPRISING DISPLAY MANUFACTURED BY THE MANUFACTURING METHOD

(75) Inventors: Tomomi Kawase, Matsumoto (JP); Tatsuya Ito, Matsumoto (JP); Satoru Katagami, Hara-mura (JP)

(73) Assignee: Seiko Epson Corporation, Tokyo (JP)

( * ) Notice: Subject to any disclaimer, the term of this patent is extended or adjusted under 35 U.S.C. 154(b) by 390 days.

(21) Appl. No.: 10/342,351

(22) Filed: Jan. 15, 2003

(65) Prior Publication Data

US 2003/0171059 A1 Sep. 11, 2003

(30) Foreign Application Priority Data

Mar. 8, 2002 (JP) .................................... 2002-063850

(51) Int. Cl.
*H01J 9/00* (2006.01)
*G02F 1/1333* (2006.01)

(52) U.S. Cl. .......................................... 445/24; 349/56
(58) Field of Classification Search .............. 445/24, 445/25, 50, 51; 349/187, 190, 153, 56
See application file for complete search history.

(56) References Cited

FOREIGN PATENT DOCUMENTS

| JP | A 3-43701 | 2/1991 |
|---|---|---|
| JP | A 5-341118 | 12/1993 |
| JP | A 8-234153 | 9/1996 |
| JP | A 09-073011 | 3/1997 |
| JP | A 10-86456 | 4/1998 |
| JP | A 11-21483 | 1/1999 |
| JP | A 11-24604 | 1/1999 |
| JP | A 2000-221319 | 8/2000 |
| JP | A 2001-66408 | 3/2001 |
| JP | A 2001-235613 | 8/2001 |
| JP | A 2002-122727 | 4/2002 |

*Primary Examiner*—Joseph Williams
(74) *Attorney, Agent, or Firm*—Oliff & Berridge, PLC

(57) ABSTRACT

The invention provides a method enabling a display material including display elements introduced into divided regions with partition walls to be reclaimed, and a method for manufacturing a display using the method. The color filter substrate is immersed in a developer in the step for reclaiming the base. Alkali can be used as the developer that is capable of being used in the development process for forming the partition walls. The developer is not required to be the actual developer that is used for forming the partition walls. Vibration or stress is applied to the filter element as a display element using an ultrasonic cleaning bath in the step for immersing the base in the developer, and the filter element as a display element is peeled off. The base is washed with water thereafter, followed by drying to return the base to the color filter substrate forming step.

16 Claims, 18 Drawing Sheets

METHOD FOR ELIMINATING MATERIALS, METHOD FOR RECLAIMING BASE, METHOD FOR MANUFACTURING DISPLAY, AND ELECTRONIC APPLIANCES COMPRISING DISPLAY MANUFACTURED BY THE MANUFACTURING METHOD

BACKGROUND OF THE INVENTION

1. Field of Invention

The present invention relates to a method for eliminating materials, a method for reclaiming a base, a method for manufacturing a display, and an electronic appliance including the display manufactured by the method for manufacturing the display. In particular, the present invention relates to a manufacturing technology suitable for peeling and eliminating color filters and EL patterns constructed on the base to reclaim the base.

2. Description of Related Art

Color filters can be provided in various displays to enable color display. Such a color filter can include, for example, dots of R (red), G (green) and B (blue) color filter elements arranged in a pattern, such as a striped arrangement, delta arrangement and mosaic arrangement, on a base made of a glass or plastic.

The display dots that are able to independently control respective optical states are arranged on the base made of a glass or plastic in the displays, such as a liquid crystal device and an EL (electroluminescence) device. The display dots are usually arranged into a lattice (dot matrix) extending as longitudinal and transverse arrays.

The display dots are formed corresponding to respective colors of, for example, R, G and B in the display capable of color display, and one pixel for full color display includes three display dots. Color display is enabled by independently controlling gradation of the plural display dots included in one pixel.

In one example of the manufacturing process of the display, a lattice of partition walls (bank) is formed by applying a photosensitive resin on the base, and the photosensitive resin is exposed and developed. Display elements (filter elements of the color filter or display dots) are formed by hitting droplets of color materials discharged from nozzle heads in the region divided by the partition walls followed by drying. This method is suitable to efficiently manufacture a small size display to be used for portable type electronic appliances, such as cellular phones and portable type information terminals, because patterning of display elements with respective colors is not needed by photolithography or the like. It is another advantage of this method that a fine and precise display to be used for a projector and the like can be readily manufactured.

SUMMARY OF THE INVENTION

However, products having defects, such as vacant display elements, and mingled foreign substances, such as dusts in the display element, may appear in the manufacturing process as described above, because the base (color filter substrate, liquid crystal panel, EL panel and the like) as a display material are formed by arranging many display elements on the base. While the base as a defective display material has only been discarded, its disposal may be difficult due to an increased amount of discarded material that has been refused with potential pollution of the environment.

Accordingly, a method for peeling defective display elements and reclaiming the base as the display material has been provided for the defective base. All the constituting elements on the base are eliminated by dissolving the partition walls and display elements with an acid, or by decomposing them by plasma ashing in order to introduce the base into the step for forming the partition walls again after cleaning the base. Employing this method enables the base to be reclaimed.

However, since all the constituting elements on the base are eliminated by decomposition in the peeling and reclaiming method as described above, the manufacturing process using the reclaimed base should be started from its initial manufacturing step. Accordingly, the manufacturing efficiency is not enhanced since only reclaiming the base provides only a small advantage.

Accordingly, the present invention addresses or solves the foregoing problems, and provides a method for effectively reclaiming a base as a display material including display elements introduced into the region divided by partition walls, and a method for manufacturing a display using the method.

The present invention that addresses or solves the above problems provides a method for eliminating a material disposed on a region divided by partition walls formed on a base. The partition walls are left behind on the base while eliminating the display element.

When the material is defective or incomplete, or when foreign substances are mingled into the material, only the material is eliminated while leaving the partition walls behind according to the present invention. Consequently, the manufacturing efficiency may be further enhanced with further reduction of waste material that has been refused, since no new partition walls are required to be formed on the base, and only a new material may be disposed in the region divided by the partition walls remaining on the base.

Preferably, the partition walls are formed by exposing a radiation sensitive material to a radiation (exposure) and by developing the exposed material, and the material is peeled off or dissolved by a development substance capable of using for development.

According to the present invention, the material on the base is peeled off by employing the development substance (for example, by immersing the material in the developer) capable of using for development in the partition wall forming step. Accordingly, it is possible to peel or dissolve only the material while leaving the partition walls to be intact behind, since the partition walls are seldom damaged by the development substance.

The radiation sensitive material as used herein refers to as a material that is denatured by irradiating various radiation, such as a visible light, UV light, X-ray and electron beam, and is constructed so that the portions irradiated or not irradiated are eliminated by development thereafter. The development substance capable of being used for development refers to a development substance (for example a developer) that is able to form the partition walls by employing the radiation sensitive material after irradiating with a radiation. Accordingly, the substance is not restricted to those actually used in the step for forming the partition walls.

Preferably, vibration or stress is applied for peeling off or dissolving the material.

The material becomes ready for peeling or dissolving by applying vibration or stress according to the present invention. Practically, the material is rubbed with other members, an ultrasonic wave is applied through the development substance (developer), or the developer is blown as a shower or as a high pressure stream. While vibration or stress may be applied before applying the development substance (before immersing in the developer), it is more preferable to apply vibration or stress while the development substance is applied to the material (while the developer is adhered on the material).

Preferably, the material is formed by introducing a liquid material into a region divided by the partition walls.

Only the material is readily eliminated while leaving the partition walls behind, when the material is disposed by introducing the liquid material in the region divided by the partition walls. The liquid material may be readily disposed by discharging it as droplets from a droplet discharge head and hitting them in the region. A nozzle head may be used as the droplet discharge head.

Preferably, the material is eliminated as a material before solidification.

While the liquid material should be solidified by drying and hardening to introduce the liquid material into the region, the degree of damage to the partition walls may be reduced or the display element may be more readily eliminated by eliminating the materiel before solidification of the liquid material in the present invention. The material before solidification as used herein refers to as a liquid material remaining as a liquid, or a material requiring spontaneous drying or baking (final baking) thereafter, although the material is temporarily dried or pre-baked (calcinated).

Preferably, the material is a filter element constituting a color filter.

While defects may be generated by vacancy of the material in the region, excess or insufficient quantity of the material or immigration of foreign substances in the filter element of the material, only the defective filter element may be eliminated to reconstruct the color filter in the present invention. Consequently, the manufacturing efficiency of the color filter or various articles including the color filter can be enhanced with enhanced quality of the color filter.

Preferably, the material is an EL substance.

The manufacturing efficiency of the EL device and other articles including the EL device may be enhanced by forming the material with the EL substance and reconstructing the EL device by eliminating the EL substance only while enchancing the display quality of the EL device. When the EL substance includes two layers of a positive hole injection layer and an EL layer, or three layers of the positive hole injection layer, EL layer and an electron injection layer, all the two or three layers may be eliminated, or the uppermost layer of these layers may be eliminated.

The present invention provides a method for reclaiming a base including forming a material on a base after eliminating the material formed on the base. The method for eliminating the material as described above may be employed as the elimination step of the material.

Since the material is formed again after eliminating only the material while leaving the partition walls behind, the partition walls are not required to be reconstructed on the base, thereby enabling the number of the manufacturing steps to be reduced and the overall manufacturing cost to be lowered.

The present invention provides a method for manufacturing a display inlcuding: forming partition walls on a base; introducing a display element in the region divided by the partition wall to form the base; inspecting the base; leaving the partition walls behind on the base when a defective display element is found while eliminating the display element; and disposing another display element again in the region divided by the partition wall after eliminating the defective display element.

The display element is eliminated while leaving the partition walls behind when a defective display element is found in the manufacturing process of the display. Consequently, the base may be formed by introducing only the display element again into the region divided by the partition walls left behind on the base with no need of reconstruction of new partition walls, thereby enabling the manufacturing efficiency to be enhanced.

Preferably, the partition wall is formed by irradiating radiation to a radiation sensitive material and developing the irradiated material in the step for forming the partition wall; and the display element is peeled off or dissolved by a development substance capable of using for development in the step for eliminating the display element.

The display element on the base is peeled or dissolved by applying (by immersing the display element in the developer) the development substance capable of being used for development of the partition walls in the manufacturing step thereof. Consequently, only the display element may be peeled off or dissolved while leaving the partition walls behind, since the partition walls are seldom damaged by the development substance.

Preferably, vibration or stress is applied to the display element for peeling off or dissolving the display element.

The display element is readily peeled off or dissolved by applying vibration or stress to the display element. Practically, the material is rubbed with other members, an ultrasonic wave is applied through the development substance (developer), or the developer is blown as a shower or as a high pressure stream. While vibration or stress may be applied before applying the development substance (before immersing in the developer), it is more preferable to apply vibration or stress while the development substance is applied to the material (while the developer is adhered on the material).

Preferably, a liquid material as the display element is introduced in the region divided by the partition wall in the step for introducing the display element to form the base.

The display element is more readily eliminated while leaving the partition walls behind, when the display element is disposed in the region by introducing the liquid material into the region divided by the partition walls. The liquid material may be readily disposed by discharging it as droplets from a droplet discharge head and impacting them in the region. A nozzle head may be used as the droplet discharge head.

Preferably, the method for manufacturing the display includes completely solidifying the display element when no defective element has been found, and the display element is eliminated before solidification in the step for eliminating the display element.

Meaningless processing may be omitted in the base having defective elements by completely solidifying the display element in which no defective display elements have been found. The display element may be readily eliminated, on the other hand, in the step for eliminating the display element before completely solidifying the display element, thereby enabling the partition walls to be hardly damaged.

Preferably, the display element is a filter element constituting a color filter.

While defects may be generated by vacancy of the material in the region, excess or insufficient quantity of the material or immigration of foreign substances in the filter element of the display element, only the defective filter element may be eliminated to reconstruct the color filter in the present invention. Consequently, the manufacturing efficiency of the color filter or various articles including the color filter can be enhanced with enhanced quality of the color filter. While the display is not restricted so long as it includes the color filter, it may be electrooptical devices such as a liquid crystal device and an EL device.

Preferably, the display element is an EL substance.

Since the EL device may be reconstructed by eliminating only the EL substance when the display element includes the EL substance, the manufacturing efficiency of the EL device or various articles including the EL device may be enhanced with enhanced display quality of the EL device. When the EL substance includes two layers of a positive hole injection layer and an EL layer, or three layers of the positive hole injection layer, EL layer and an electron injection layer, all the two or three layers may be eliminated, or the uppermost layer of these layers may be eliminated.

An electronic appliance according to the present invention is an electronic appliance that mounts the display manufactured by any one of the manufacturing methods as described above.

BRIEF DESCRIPTION OF THE DRAWINGS

FIG. 12(a) is a partially broken-away perspective view, and FIG. 12(b) is a cross-sectional view taken along plane J—J in FIG. 12(a).

DETAILED DESCRIPTION OF PREFERRED EMBODIMENTS

Embodiments of the method for reclaiming a base as a display material, and of the method for manufacturing a display according to the present invention will be described in detail hereinafter with reference to attached drawings. The base as the display material according to the present invention basically includes partition walls formed on the base, and a display element is disposed in each region divided by the partition walls. The base may be a plain base, or electrodes and other layers may be formed on the base. The display element may be a filter element of a color filter, or may constitute all or a part of display dots arranged in the display. An embodiment in which the base as the display material is a color filter substrate, an embodiment in which the base as the display material or the display is an EL panel, and an embodiment of the display (an electrooptical device) including the color filter as the base will be sequentially described hereinafter.

[Method for Reclaiming and Manufacturing Color Filter Substrate]

Figure 3:
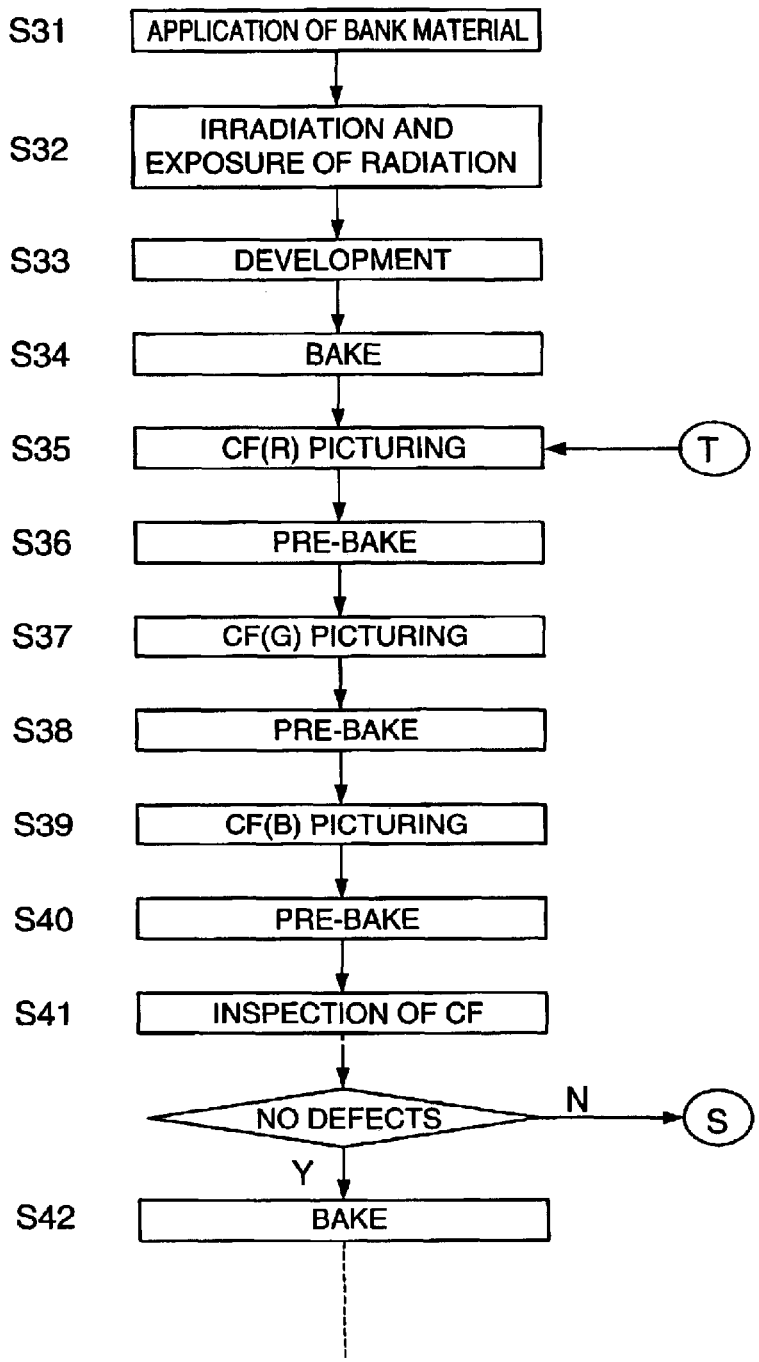
FIG. 3 is a flowchart showing a procedure for manufacturing the color filter substrate in the same embodiment.

The embodiments for reclaiming the base as the display material according to the present invention will be described first. FIGS. 1A–1G are cross-sectional views of the color filter substrate as the display material of the present invention in the manufacturing steps A to G. FIG. 3 is a schematic flowchart showing the outline of the process for manufacturing the color filter substrate. The manufacturing process of the color filter substrate will be described hereinafter with reference to FIGS. 1A–1G and 3.

Figure 1A:
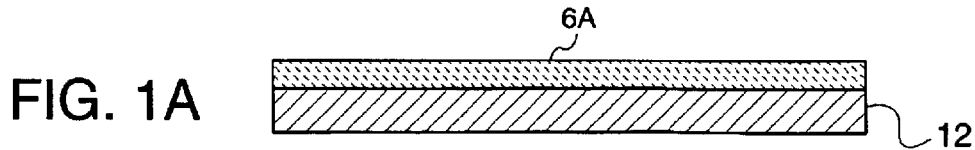
FIGS. 1A to 1G are schematic cross-sections showing steps for manufacturing the color filter substrate as an embodiment of the methods for eliminating the material, for reclaiming the base material and for manufacturing the display according to the present invention.

As shown in FIG. 1A, a radiation sensitive material 6A is applied on the surface of a substrate 12 made of a transparent glass or plastic by various methods such as a spin coating (rotation coating), drain coating and roll coating (step S31 shown in FIG. 3). The radiation sensitive material 6A is preferably a resin composition. The thickness of the material 6A after coating is usually 0.1 to 10 $\mu$m, preferably 0.5 to 3.0 $\mu$m.

Exemplary resin compositions include (i) a radiation sensitive resin composition that contains a binder resin, polyfunctional monomer and polymerization initiator, and is curable by irradiating a radiation, and (ii) a radiation sensitive resin composition that contains a binder resin, a compound that generates an acid by irradiating a radiation, and a cross-linking compound capable of cross-linking by the action of the acid generated by irradiating a radiation, and is curable by irradiating a radiation. These resin compositions can typically be prepared as liquid compositions by being mixed with a solvent before use, which may be either a high boiling point or a low boiling point solvent. The material 6A according to the present invention, which is described in Japanese Unexamined Patent Publication No. 10-86456, is preferably a composition including (a) a copolymer of hexafluoropropylene, unsaturated carboxylic acid (acid anhydride) and other copolymerizable ethylenic monomers, (b) a compound that generates an acid by irradiating a radiation, (c) a cross-linking compound capable of being cross-linked by the action of the acid generated by irradiating a radiation, (d) fluorinated organic compounds other than the composition in A, and (e) a solvent that can dissolve the compositions (a) to (d).

Then, the material 6A is irradiated with (exposed to) a radiation through a prescribed patterning mask (step S32 in FIG. 3). While the radiation as used in the specification includes a visible light, UV light, X-ray and electron beam, the wavelength of the radiation (light) is preferably in the range of 190 to 450 nm.

Figure 1B:
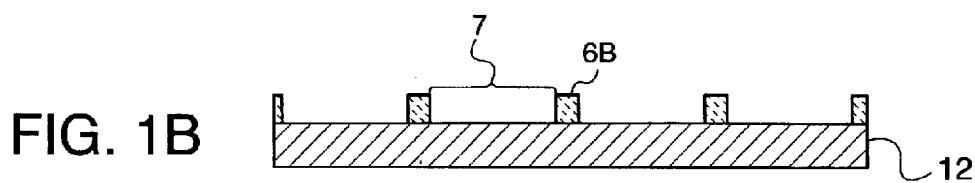

Subsequently, partition walls (banks) 6B as shown in FIG. 1B are formed by developing the material 6A (step S33 in FIG. 3). The partition walls 6B are constructed into a shape (negative or positive pattern) corresponding to the patterning mask. The preferable shape of the partition walls 6B is, for example, a lattice that is divided so that rectangular filter element forming regions 7 are arranged in the longitudinal and transverse direction on a plane. The developer to be used to develop the material 6A is an alkaline developer. Examples of the alkaline developer include aqueous solutions of sodium carbonate, sodium hydroxide, potassium hydroxide, sodium silicate, sodium metasilicate, aqueous ammonia, ethyl amine, n-propyl amine, diethyl amine, di-n-propyl amine, triethylamine, methyldiethyl amine, dimethyl ethanolamine, triethanol amine, tetramethylammonium hydroxide, choline, pyrrole, piperidine, 1,8-diazabicyclo[5, 4,0]-7-undecene and 1,5-diazabicyclo[4,3,0]-5-nonene. An appropriate amount of water soluble organic solvent, such as methanol and ethanol, and surfactants may be added. The material is usually washed with water after development with the alkali developer.

Figure 1C:
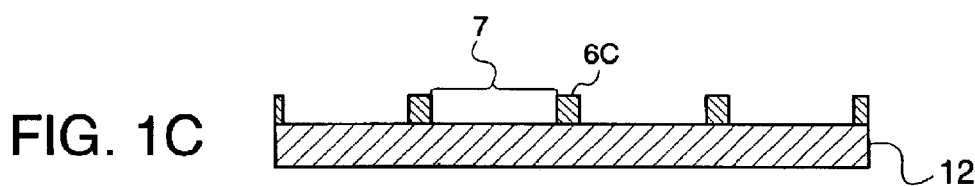
Figure 1D:
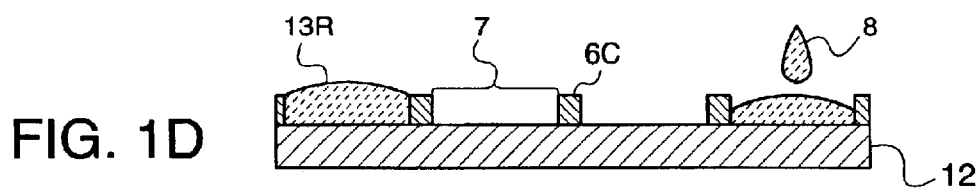
Figure 1E:
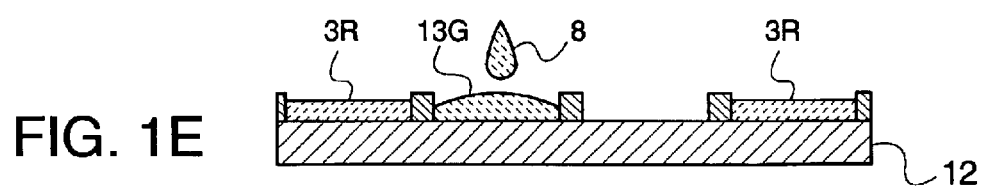
Figure 1F:
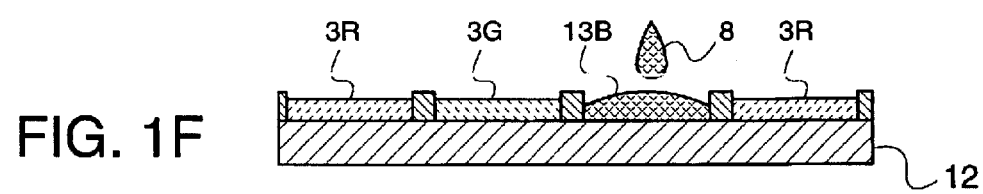

As shown in FIG. 1C, the partition walls 6B are converted into partition walls 6C thereafter by baking (firing) at about 200° C. The baking temperature is appropriately adjusted depending on the material 6A. Some materials 6A do not require baking. Although the partition walls 6C are formed of a light shielding material in this embodiment, they function literally as barriers to divide (isolating) each region 7, and as a light shielding layer that shields the portion other than the region 7. However, the walls may have only a function as the barrier. A light shielding layer including a metal may be provided independently from the barrier.

Filter element materials 13 (13R (red colorant), 13G (green colorant) and 13B (blue colorant) in the exemplified drawing) are introduced into each region 7 divided by the partition walls 6C formed as described above. While an appropriate method may be used to introduce the filter element materials 13 into each region 7 (for example a photolithographic method using a radiation sensitive colorant or vapor phase deposition method), it is particularly preferable to introduce a liquid material, prepared by mixing the filter element materials 13 with a solvent, into the region 7. Practically, the material is introduced into the region in this embodiment by discharging droplets from a droplet discharge head (head) and by hitting the droplets 8 of the liquid material into the region 7.

A dispersion prepared by dispersing a pigment, dye or other colorants in a base material (preferably a resin material), such as an acrylic resin may be used as the filter element material 13. An appropriate solvent, for example an organic solvent, is preferably mixed in addition to the base material and colorant to construct the liquid material.

The filter element material 13 is introduced as the liquid material, and is temporarily solidified or cured by pre-baking (calcination) by drying or by baking at a low temperature (for example 60° C.). For example, the filter element material 13R is introduced (FIG. 1D and step S35 in FIG. 3) followed by pre-baking the filter element material 13R to form the filter element 3R (step S36 in FIG. 3), the filter element material 13G is introduced thereafter (FIG. 1(e) and step S37 in FIG. 3) followed by pre-baking the filter element material 13G to form the filter element 3G (step S38 in FIG. 3), and the filter element 13B is introduced (FIG. 1(f) and step S39 in FIG. 3) followed by pre-baking the filter element 13B to form the filter element 3B (step S40 in FIG. 3). The display material (the color filter substrate) is formed by introducing the three color filter element materials into respective regions 7 to form the filter element 3 (3R, 3G and 3B) as temporarily solidified or cured display elements.

Subsequently, the color filter substrate as the display material constructed as described above is inspected (step S41 in FIG. 3). The dividing walls 6C and filter element 3 as the display element are observed by the naked eye or under a microscope. The filter elements may be automatically inspected based on the photographic image by photographing the color filter substrate. When defects are found in the filter element 3 as the display element, the color filter substrate is transferred to a reclaiming step to be described hereinafter.

The defects of the filter element 3 include a void of the filter element 3 (so-called vacant dots); an inappropriate amount (volume) of the material, such as excess or deficiency of the amount of the material disposed in each region 7, although the filter element 3 is formed; and a mingling of foreign substances, such as dusts, although the filter element 3 is formed.

Figure 1G:
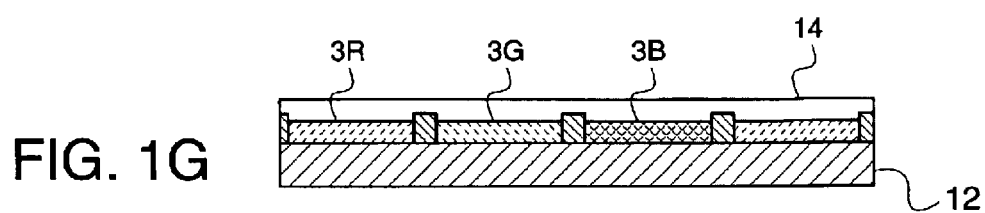

When no defects have been found in the base as the display material in the inspection as described above, the base is baked (fired) at a temperature of, for example, 200° C. to completely solidify or cure the filter element 3 (3R, 3G and 3B) as the base of the display material (step S42 in FIG. 3). The baking temperature is appropriately determined by the composition of the filter element material 13. The material is not always required to be heated at a high temperature, and may be merely dried or aged in an atmosphere (in a nitrogen gas or dry air) that is different from ambient atmosphere. The word "completely" as used herein means that the material is completely ready for final use as the display material, and does not mean that fluidity of the filter element 3 is completely lost, or fluid fractions are completely eliminated. Finally, a transparent protective layer 14 is formed on the filter elements 3, as shown in FIG. 1G.

Although the display material (color filter substrate) may be inspected when the filter elements 3 (3R, 3G and 3B) have been introduced in the process above, inspection is not necessarily restricted to such embodiment. For example, formation or introduction may be inspected when a part of the filter elements 3 is formed, or when a part of the filter element materials 13 are introduced before temporary solidification or curing; for example only the filter element 3R is inspected immediately after introducing only the filter element material 13R into the region 7. The base may be immediately transferred to the base reclaim step when defects are found in the inspection of a part of the base, or the base may be transferred after completing all the inspections.

The base reclaim step, applied when defects (failures) of the filter elements 3 as the display element have been found in the inspection of the display material, will be described hereinafter with reference to FIGS. 2A–2E and 4. FIGS. 2A–2E are cross-sectional views of the base reclaim process, and FIG. 4 is a schematic flowchart showing the outline of the process of the base reclaim steps.

Figure 2A:
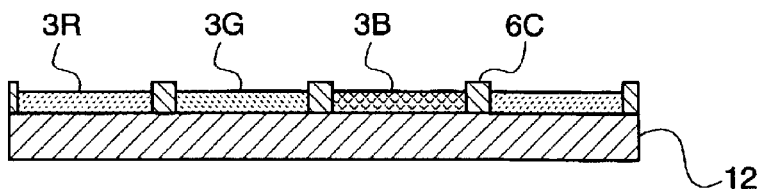
FIGS. 2A to 2E are schematic cross-sections showing steps for reclaiming the base in the same embodiment.
Figure 2B:
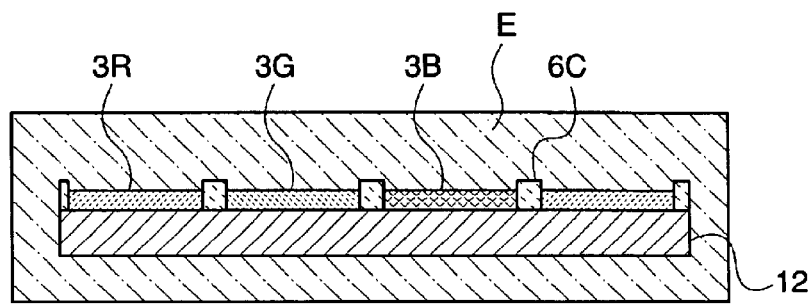
Figure 4:
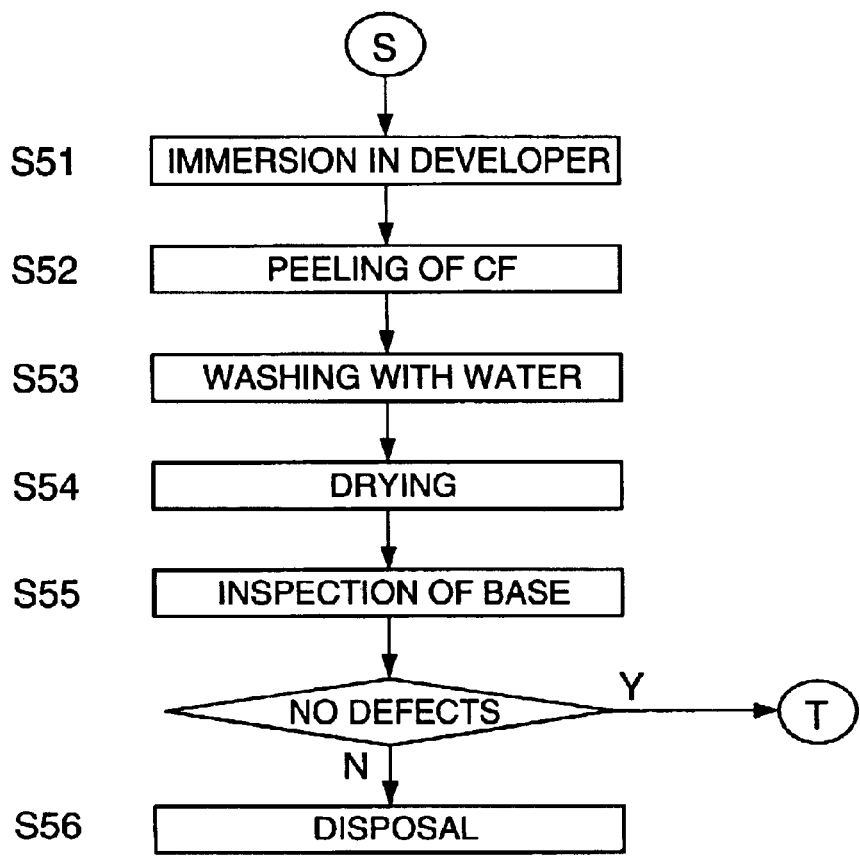
FIG. 4 is a flowchart showing a procedure for reclaiming the base in the same embodiment.

In this base reclaim steps, the color filter substrate as shown in FIG. 2A is immersed in a developer E as shown in FIG. 2B (step S51 shown in FIG. 4). The developer E available is the developer that is used for development of the partition walls 6 as described above, particularly the alkali solution. While the developer itself that is used for forming the partition walls 6B may be used for the developer E, it may be a different developer. For example, while an aqueous sodium carbonate solution is used in the step for forming the partition walls 6B, an aqueous potassium hydroxide solution may be used for the base reclaim steps.

It is preferable to apply physical vibration or stress in the immersion step in the developer E by applying ultrasonic vibration to the filter element 3 as the display element using an ultrasonic cleaning bath, by gently rubbing with a cloth or sponge, by blowing a shower of the developer E, or by blowing a high pressure developer E. Vibration or stress is preferably applied by allowing the developer E to contact the filter element 3 as the display element (by immersing in the developer). Alternatively, the color filter substrate as the display element is once taken out of the developer E to apply vibration or stress, followed by immersing the base into the developer E again. Otherwise, the display material may be merely immersed in the developer E without applying any process as described above.

Figure 2C:
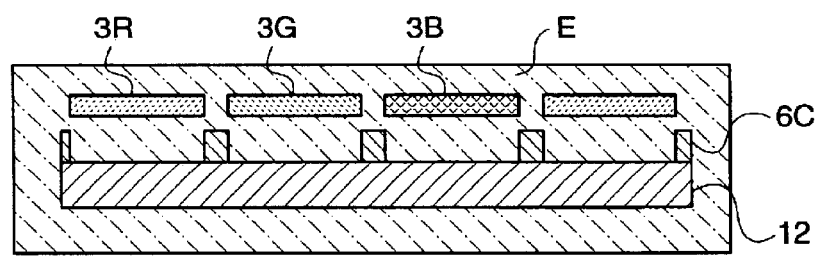

The filter elements 3 (3R, 3G and 3B) as the display element are peeled by immersing the color filter substrate as the display element into the developer E as shown in FIG. 2C and step S52 in FIG. 4, and by applying vibration or stress, if necessary. The filter element is made to be readily peeled from the substrate 12 and partition walls 6C by allowing a part of the filter element 3 to dissolve in the developer E. On the other hand, the partition walls 6C formed on the substrate 12 is seldom damaged since the developer E is used to pattern the partition walls 6C themselves, and intact partition walls are left behind. Particularly, the partition wall is not affected by the developer E at all in this embodiment, since the partition walls 6C have been baked in the step S34 in FIG. 3 after development in the step for forming the partition walls.

Figure 2D:
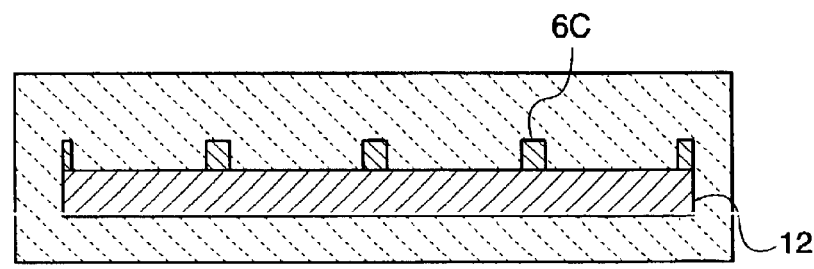
Figure 2E:
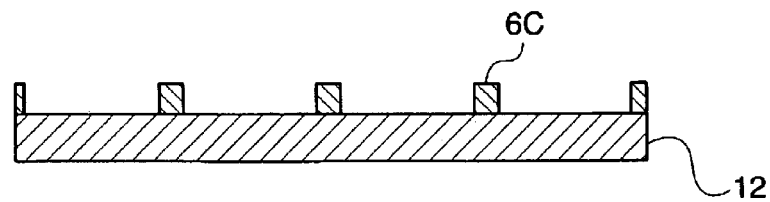

Then, the base is washed with water as shown in FIG. 2D (step S53 in FIG. 4) followed by drying (step S54 in FIG. 4), thereby obtaining the reclaimed substrate 12 on which only the partition walls 6C are left behind as shown in FIG. 2E. The base constructed as described above is inspected by observing by naked eyes or under a microscope (step S55 in FIG. 4). The base is scrapped when defects (cracks, peeling or fault) of the base and partition walls 6C are found (step S56 in FIG. 4), while the base having no defects is returned to the step S35 in FIG. 3, or to the color filter picturing step.

The reclaimed base as described above is subjected to respective processing in step S35 and thereafter shown in FIG. 3, and a display material (color filter substrate) is formed.

Only the filter elements 3 are eliminated while leaving the partition walls 6C formed on the substrate 12 behind in the base reclaim step in the embodiment described above. Accordingly, no processing starting from the partition wall forming step is required after regeneration of the base, and the reclaimed base may be immediately introduced into the step for forming the filter elements. Therefore, manufacturing efficiency may be enhanced while largely decreasing the manufacturing cost.

Since each filter element of 3R, 3G and 3B is formed by discharging respective materials in the method for manufacturing the color filter substrate according to the present invention using the droplet discharge apparatus to be described hereinafter, no complex steps are necessary with no waste of the material as required in the process using the photolithographic method.

[Methods for Reclaiming and Manufacturing EL Panel]

Embodiments of the methods for reclaiming the base as the display element according to the present invention and for manufacturing the display will be described hereinafter with reference to FIGS. 5A to 8. FIGS. 5A–5G are cross-sectional views of the base showing the method for manufacturing the EL panel as the display. FIGS. 6A–6E are cross-sectional views of the base showing the method for reclaiming the EL panel as the display material. FIG. 7 is a schematic flowchart showing the outline of the manufacturing process of the EL panel as the display. FIG. 8 is a schematic flowchart showing the outline of the reclaim process of the base of the EL panel as the display.

Figure 5A:
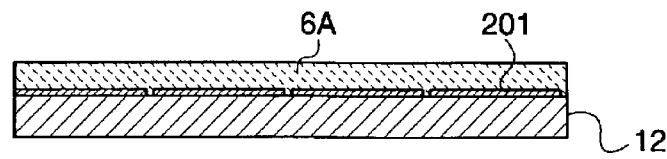
FIGS. 5A to 5G are schematic cross-sectional views showing steps for manufacturing the EL panel as an embodiment of the methods for eliminating the material, for reclaiming the base material and for manufacturing the display according to the present invention.
Figure 6A:
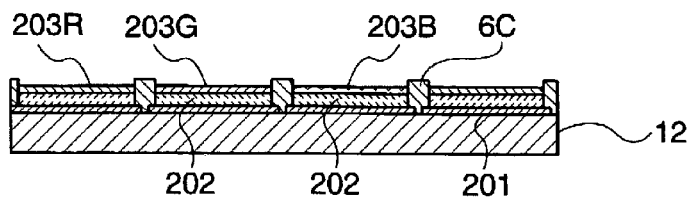
FIGS. 6A to 6E are schematic cross-sectional views showing steps for reclaiming the base in the same embodiment.
Figure 6B:
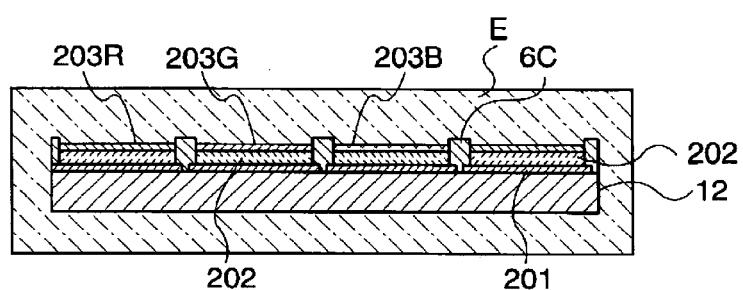

A first electrode 201 shown in FIG. 5A is formed on the substrate 12 made of a transparent glass or plastic to manufacture the EL panel. When the EL panel is a passive matrix type EL element, the first electrode 201 is formed as a belt, while the first electrode 201 is independently formed for every display dot when the EL panel is an active matrix type EL element including TFD elements or TFT elements (not shown) on the substrate 12. A photolithographic method, vacuum deposition method and pyro-sol method may be used to form these structures. The materials of the first electrode 201 available include ITO (Indium. Tin Oxide), tin oxide, and a composite oxide of indium oxide and zinc oxide.

Figure 5B:
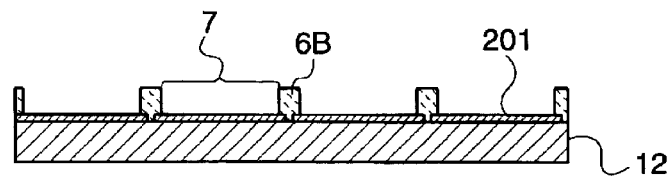

The radiation sensitive material 6A is applied on the first electrode 201 by the same method as used in the color filter base (step S61 in FIG. 7). Then, partition walls (banks) 6B are formed as shown in FIG. 5B by irradiating a radiation (exposure; step S62 in FIG. 7) and development (step S63 in FIG. 7).

The banks 6B are formed as a matrix so as to separate respective first electrodes 201 formed on each display dot, or so as to construct the EL element forming region 7 corresponding to each display dot. The bank preferably has a light shielding function as in the color filter base, thereby enabling contrast to be enhanced, mixing of colors of the luminous material to be prevented or substantially prevented, and leak of the light between the pixels to be prevented or substantially prevented. The same materials as used in the partition walls of the color filter base may be basically used for the material of the partition walls 6B. However, it is particularly desirable that the material of the partition walls are resistant to the solvent for the EL material as will be described hereinafter, and that the material is able to be converted into a tetrafluoroethylene resin by a fluorocarbon plasma treatment. The material is preferably an organic material, such as an acrylic resin, epoxy resin and a photosensitive polyimide.

The substrate 12 is continuously treated with an oxygen gas and fluorocarbon gas plasma immediately before applying a positive hole injection layer material as a functional fluid. The surface of the polyimide resin is endowed with a water repelling property and the surface of ITO becomes hydrophilic by this treatment, thereby enabling wettability of the base side for precisely patterning the droplets. Either a plasma generator in vacuum or a plasma generator in atmospheric pressure may be used as the plasma generator. Apart from this process, or in place of this process, the partition walls 6B are baked (fired) at about 200° C. (step S64 in FIG. 7), thereby forming the partition walls 6C.

Figure 5C:
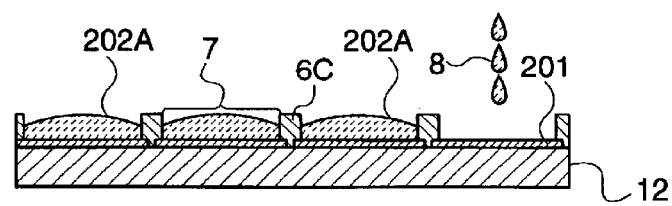

Subsequently, the positive hole injection layer material 202A is discharged as droplets 8 as shown in FIG. 5C to hit the droplets on the region 7 (step S65 in FIG. 7). The positive hole injection layer material 202A is prepared by forming a material for the positive hole injection layer into a liquid using a solvent.

Figure 5D:
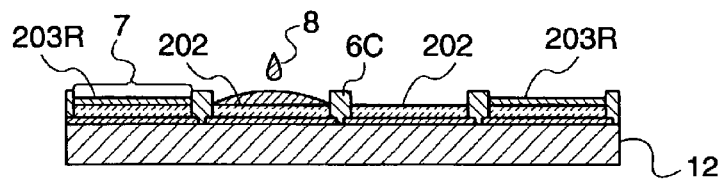

The solvent is removed in vacuum (1 torr) at room temperature for 20 minutes as a pre-baking treatment, and the positive hole injection layer 202 is formed as shown in FIG. 5D (step S66 in FIG. 7). The positive hole injection layer 202 was formed with a thickness of 40 nm under the conditions above.

An R color luminous layer material as the EL material of the functional fluid is introduced as droplets on the positive hole injection layer 202 in each region 7 by the method as shown above shown in FIG. 5D (step S67 in FIG. 7). The solvent is removed in vacuum (1 torr) at room temperature for 20 minutes as a pre-baking treatment after applying these luminous layer materials (step S68 in FIG. 7). The R color luminous layer 203R was formed with a thickness of 50 nm under the conditions above.

Furthermore, a G color luminous layer material as the EL material of the functional fluid is introduced as droplets 8 on the positive hole injection layer 202 in the region 7 by the same method as described above (step S69 in FIG. 7). After applying these luminous layer materials, the solvent is removed in vacuum (1 torr) at room temperature for 20 minutes as a pre-baking treatment (step S70 in FIG. 7). The G color luminous layer 203G formed as described above had a thickness of 50 nm.

Figure 5E:
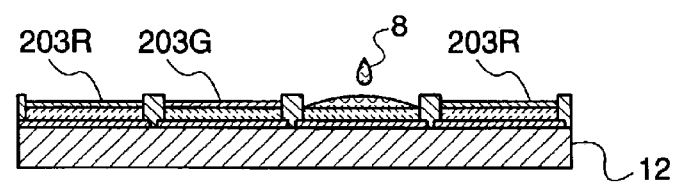

Then, a B color luminous layer 203B as an EL material of the functional fluid is introduced in the region 7 as droplets 8 as shown in FIG. 5(e). The B color luminous layer 203B is formed only in the B color dot region 7 in which the R color luminous layer and G color luminous layer have not been formed in the example (step S71 in FIG. 7). The solvent was removed thereafter in vacuum (1 torr) at room temperature for 20 minutes as a pre-baking treatment (step S72 in FIG. 7).

Related art patterns, such as a stripe arrangement, delta arrangement or mosaic arrangement, may be appropriately used as the arrangement of the R color luminous layer 203R, G color luminous layer 203G and B color luminous layer 203B depending on display performance required.

Different from the examples in the drawing, the B color luminous layer 203B may be formed in the step S71 so as to overlap the R color luminous layer 203R and G color luminous layer 203G in the display dots in which the R color luminous layer 203R and G color luminous layer 203G are formed in addition to the B color dot. This enables not only the three primary colors of R, G and B to be formed, but also the steps between the R color luminous layer 203R and partition wall 6C, and between the G color luminous layer 203G and the partition wall 6C to be filled to planarize the surface of the base, or short circuits between the upper and lower electrodes to be reliably prevented or substantially prevented from being formed. The B color luminous layer 203B functions as an electron transfer layer in the laminated structure of the R color luminous layer 203R and G color luminous layer 203G by adjusting the thickness of the B color luminous layer 203B, and the B color is not emitted. A generally used spin-coat method may be employed, or the same method as used for forming the R color luminous layer 203R and G color luminous layer 203G, may be used to form the B color luminous layer 203B as described above.

The positive hole injection layer 220 may be subjected to a continuous plasma treatment using an oxygen gas and fluorocarbon plasma before forming luminous layers of each color. A layer of a fluorinated compound is formed on the positive hole injection layer 220 by this treatment, and positive hole injection efficiency is increased by enhancing ionization potential to enable an organic EL device with a high luminous efficiency to be provided.

Subsequently, the EL panel, in which the positive hole injection layer 202, and R color luminous layer 203R, G color luminous layer 203G or B color luminous layer 203B are formed on each display dot, is inspected by observation by the naked eye or under a microscope, or by image processing (step S73 in FIG. 7). When defects (vacant dots, defective lamination structure, excess or deficient amount of luminous materials and mingle of foreign substances such as dusts) have been found in the EL luminous element (including a laminate of the positive hole injection layer 202, and the R color luminous layer 203R, G color luminous layer 203G or B color luminous layer 203B) in the inspection, the base is transferred to the base reclaim step to be described hereinafter. When no defects have been found in this inspection, the luminous layers are conjugated by a heat treatment in the nitrogen atmosphere at 150° C. for 4 hours.

Figure 5F:
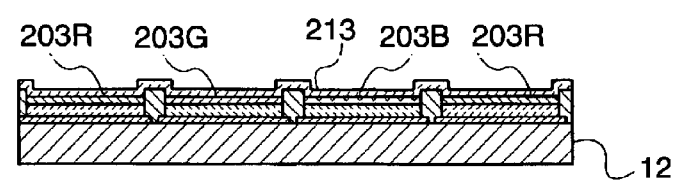
Figure 5G:
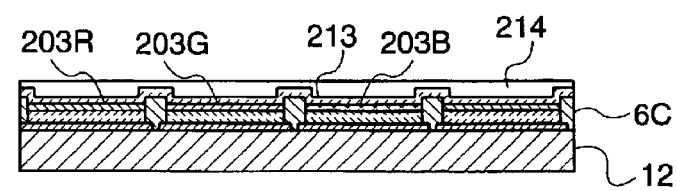

The desired EL panel is manufactured by forming an opposed electrode 213 thereafter as shown in FIG. 5F. The opposed electrode 213 can be manufactured by a deposition method, such as vacuum deposition or sputtering using, for example, Mg, Ag, Al and Li as a materiel when the electrode is planar. When the opposed electrode 213 is a striped electrode, on the other hand, the deposited electrode layer may be patterned by photolithography. A protective layer 214 is finally formed on the opposed electrode 213 using an appropriate material (such as a resin mold material or inorganic insulation layer) as shown in FIG. 5G.

The base reclaim steps shown in FIGS. 6A–6E and 8, which is applied when defective EL elements as the display elements have been found in the inspection in the step S73 in FIG. 7, will be described below. In the EL panel shown in FIG. 6A, defects have been found in the EL element disposed in the region 7 by the inspection in the step S73 in FIG. 7, and the EL panel is immersed in the developer E as shown in FIG. 6B (step 81 in FIG. 8). This developer E is also a developer capable of using in development in the step S73 in FIG. 7, as used in the foregoing embodiment. Accordingly, various developers as described in the foregoing embodiment may be also used in this embodiment. However, the developer is also not restricted to the developer itself used in the step S73 in FIG. 7, as in the forgoing embodiment.

Vibration and stress are also applied to the EL element in this step as in the foregoing embodiment. The method for applying vibration and stress is also the same as in the foregoing embodiment.

Figure 6C:
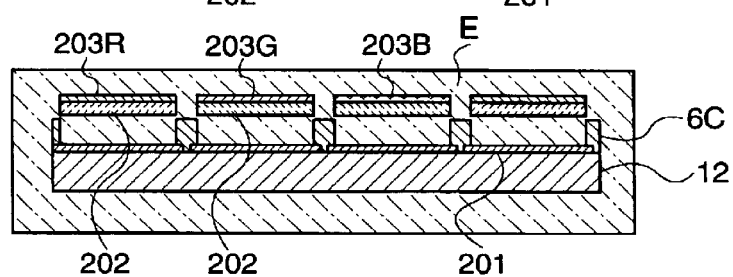
Figure 6D:
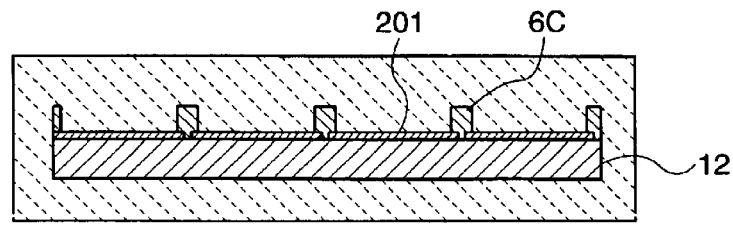
Figure 6E:
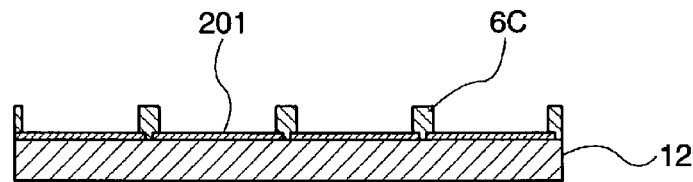
Figure 7:
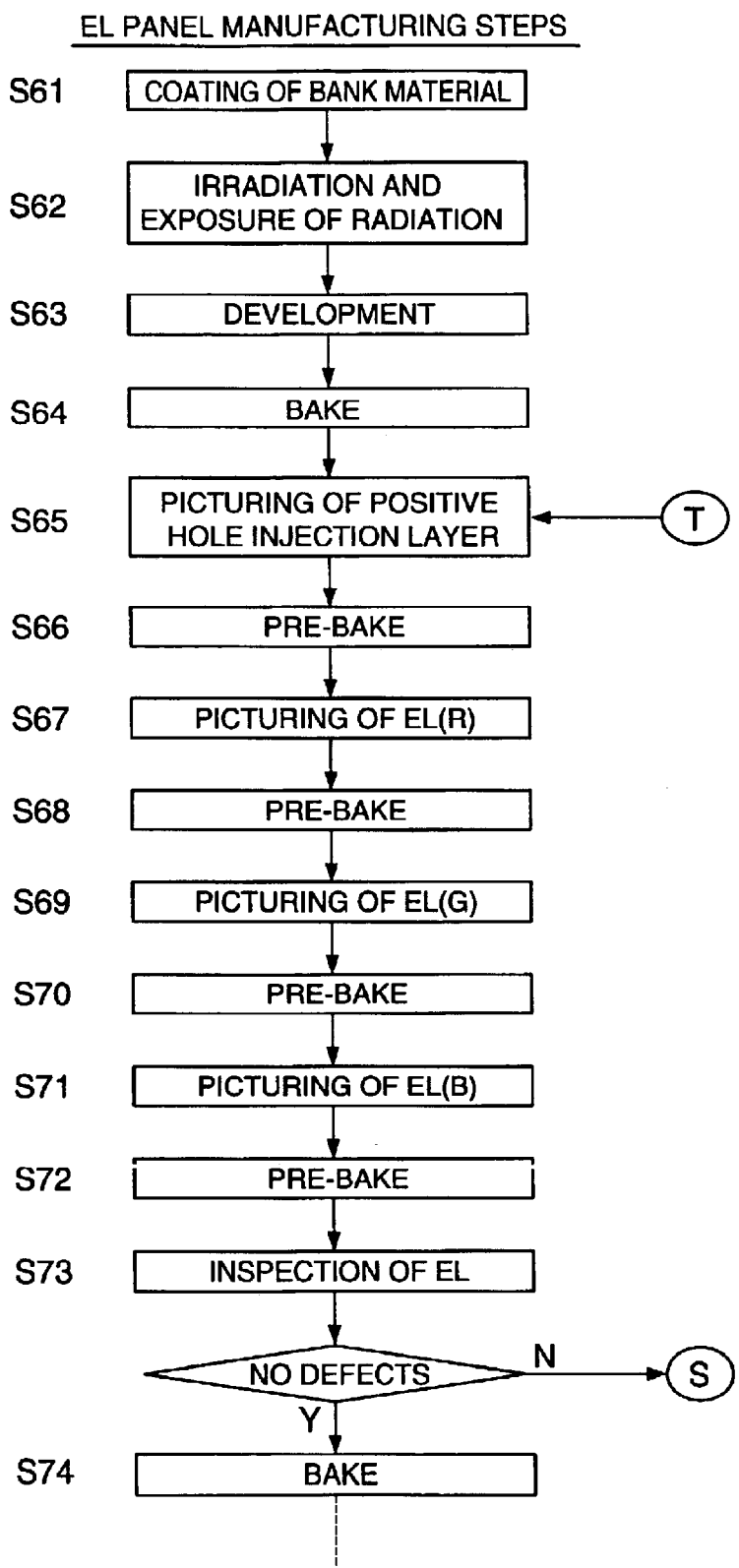
FIG. 7 is a flowchart showing a process for manufacturing the EL panel in the same embodiment.
Figure 8:
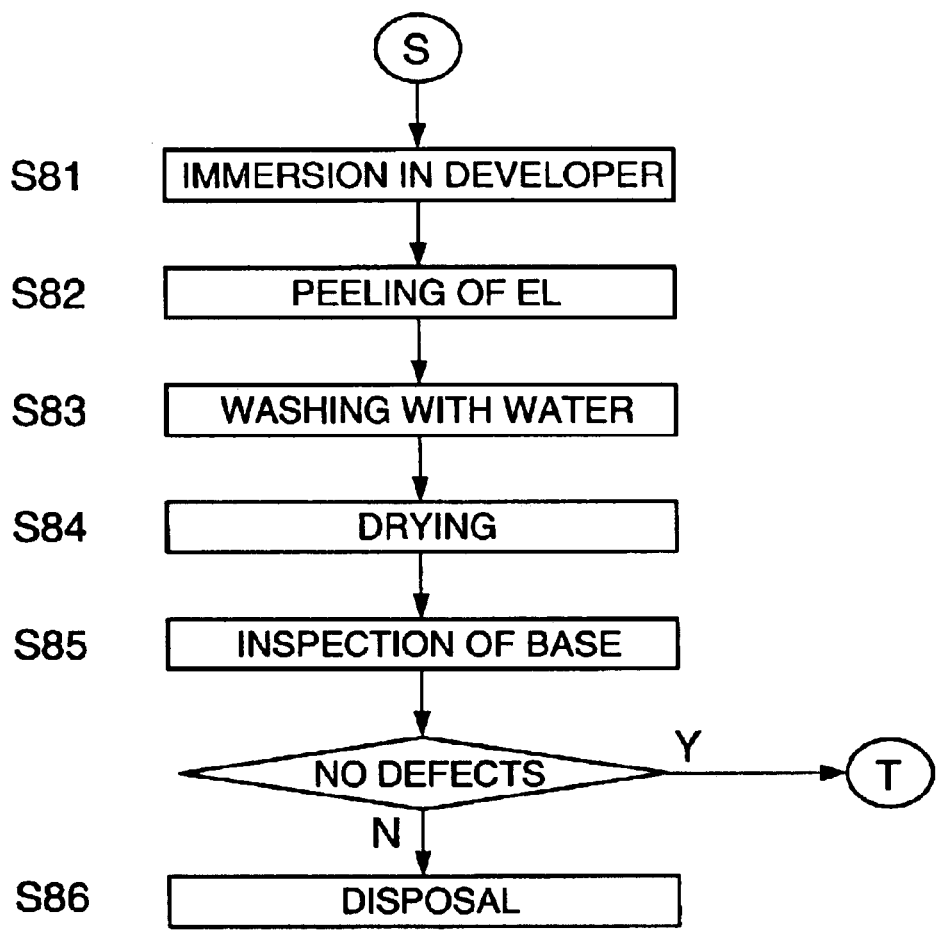
FIG. 8 is a flowchart showing a process for reclaiming the base in the same embodiment.

The EL elements, or the positive hole injection layer 202, EL layers 203R, 203G and 203B, are peeled from the region 7 by the developer E as shown in FIG. 6C (step S82 in FIG. 7). Then, the base including the substrate 12 and partition walls 6C is washed with water thereafter as shown in FIG. 6D) (step 83 in FIG. 7), and dried as shown in FIG. 6E (step 84 in FIG. 7).

The base is inspected thereafter by naked eyes or under a microscope, by automatic inspection by image processing (step S85 in FIG. 7). The base is scrapped when defects are found in the substrate 12 and partition walls 6C (step S86 in FIG. 7), and the base is introduced into the step S65 shown in FIG. 7 when no defects have been found.

According to the method for manufacturing the EL panel, since only the EL elements (positive hole injection layer 202, and EL layers 203R, 203G and 203B) are eliminated while leaving the partition walls 6C formed on the substrate 12 behind, the base after reclaim is not required to start from the partition wall forming step again, and the reclaimed base is immediately introduced into the step for forming the EL elements, thereby enabling manufacturing efficiency to be enhanced while largely reducing the manufacturing cost.

Since the EL element corresponding to the R, G and B colors, respectively, is formed by discharging respective materials using a droplet discharge apparatus to be described hereinafter in the method for manufacturing the EL panel according to this embodiment, a complicated process, such as in the method using photolithography, is not needed with no waste of the materials.

[Construction of the Droplet Discharge Apparatus]

Figure 9:
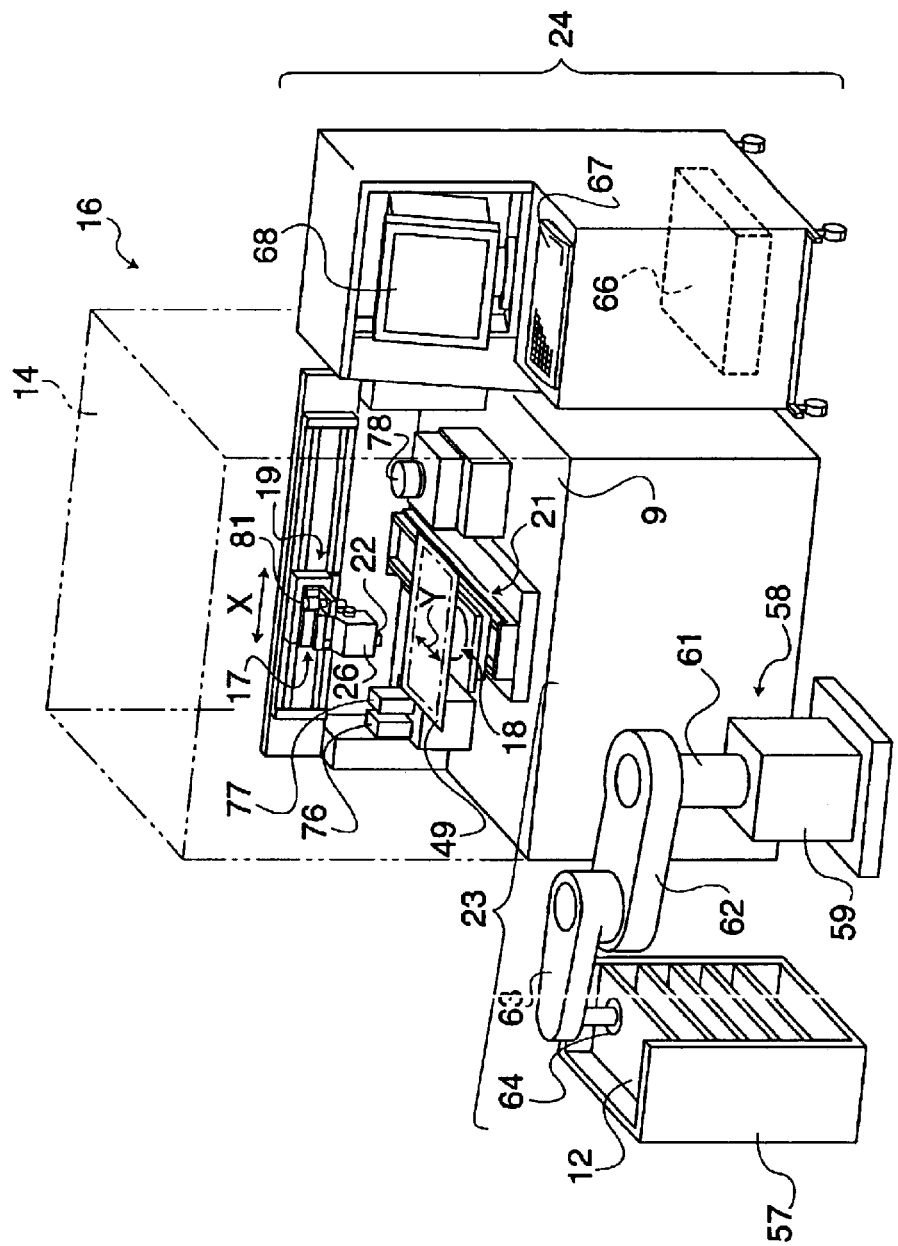
FIG. 9 is a perspective view showing an embodiment of a droplet discharge apparatus according to the present invention as a significant part of the apparatus for manufacturing the display (the apparatus for manufacturing the color filter, liquid crystal device and EL device).
Figure 10:
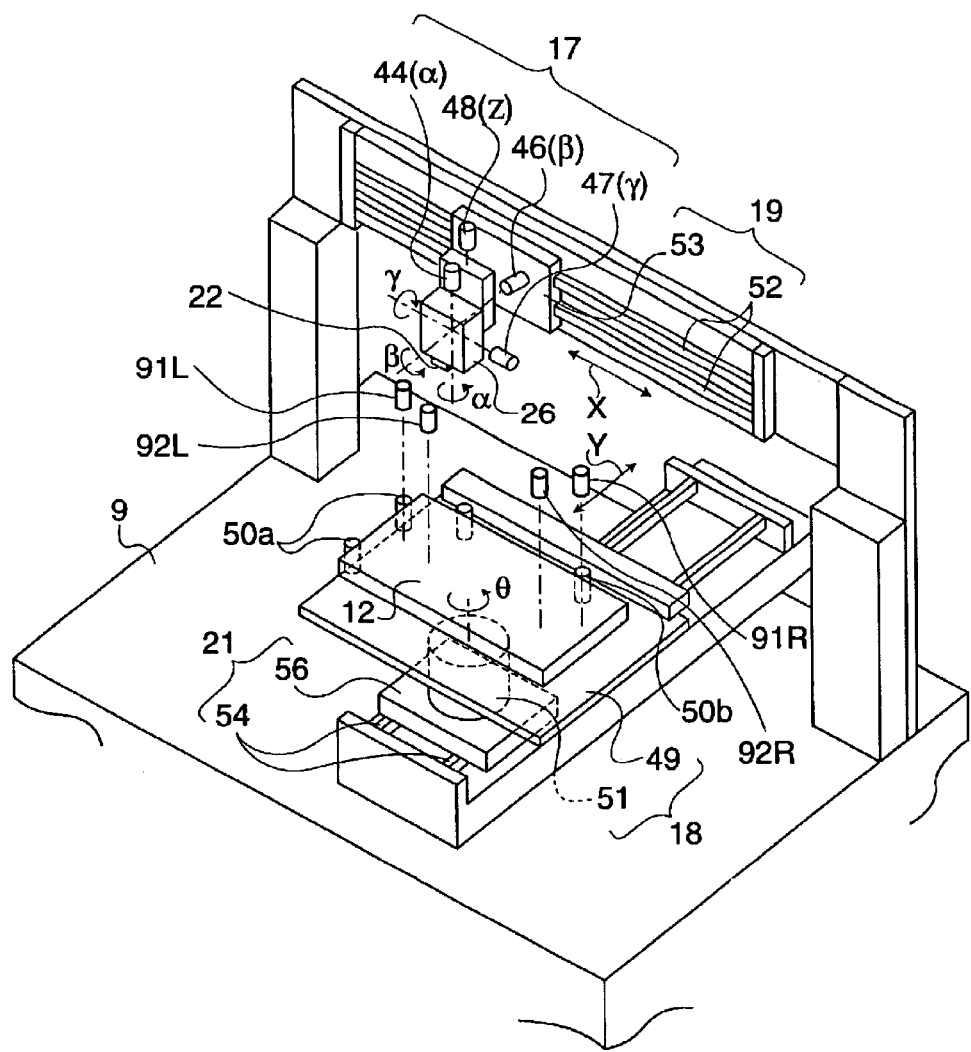
FIG. 10 is an enlarged perspective view showing a significant part of the apparatus in FIG. 9.

The construction of the droplet discharge apparatus that can be used in each embodiment will be described hereinafter. FIG. 9 is a perspective view showing the overall construction of the droplet discharge apparatus, and FIG. 10 is a partial perspective view showing a significant part of the droplet discharge apparatus.

As shown in FIG. 9, the droplet discharge apparatus 16 includes a head unit 26 as an example of the droplet discharge head including a head 22 as used in a printer, a head position controller 17 to control the position of the head 22, a substrate position controller 18 to control the position of the substrate 12, a scanning driver 19 as a scanning drive apparatus to move the head 22 in the scanning direction X relative to the substrate 12, a feed driver 21 to move the head 22 in the feed direction Y perpendicular to the scanning direction of the substrate 12, a substrate feeder 23 to supply the substrate 12 to a prescribed work position in the droplet discharge apparatus 16, and a controller 24 engaged in overall control of the droplet discharge apparatus 16.

The head position controller 17, substrate position controller 18, scanning driver 19 and feed driver 21 are placed on a base table 9. These devices are covered with a cover 14, if necessary.

Figure 11:
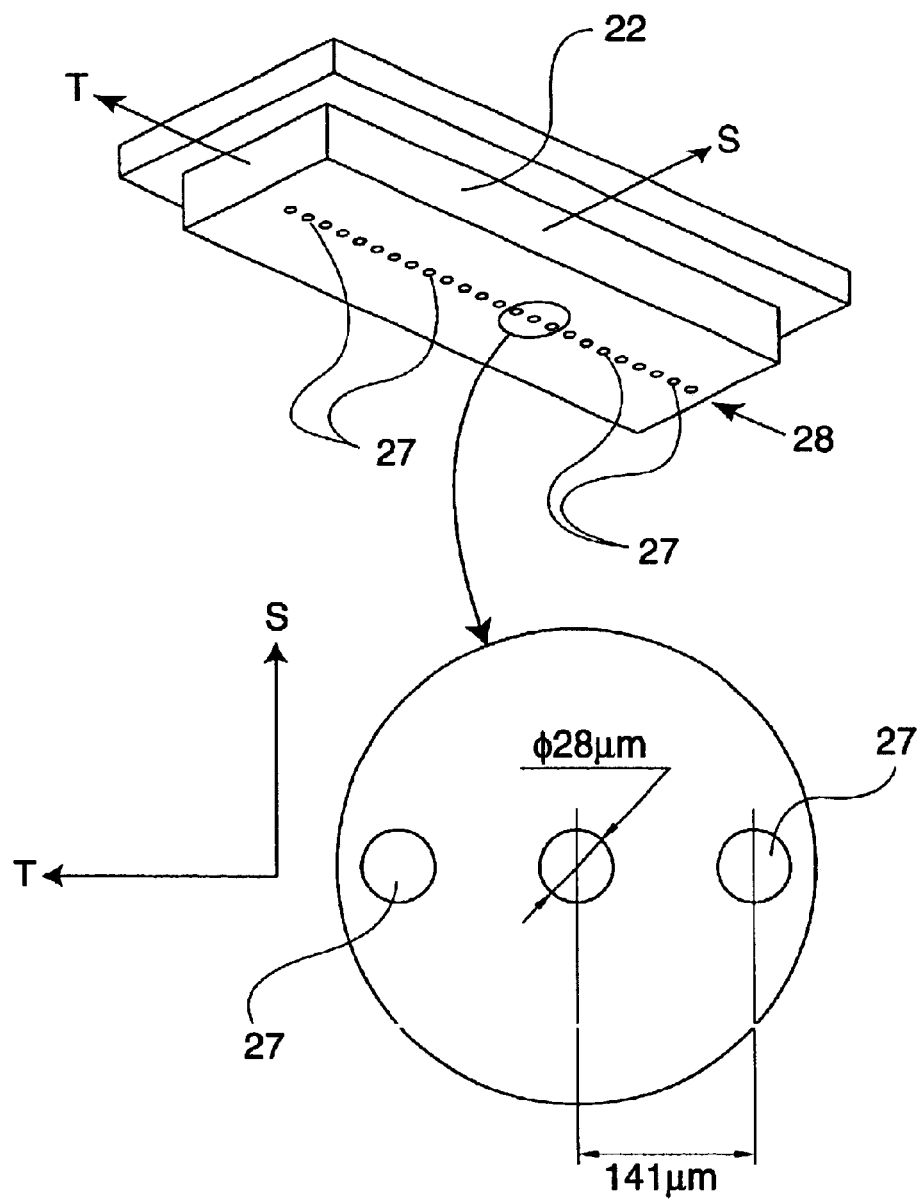
FIG. 11 is an enlarged perspective view showing a head as a significant part of the apparatus in FIG. 10.

The head 22 includes a nozzle array 28 in which a plurality of nozzles 27 are aligned as shown in FIG. 11. For example, the number of the nozzles 27 is 180, the aperture diameter of the nozzle 27 is 28 $\mu$m, and the pitch t between the nozzles 27 is 141 $\mu$m. The reference direction S shown in FIG. 11 shows the reference scanning direction of the head 22, and the alignment direction T shows the direction of alignment of the nozzle 27 in the nozzle array 28.

Figure 12:
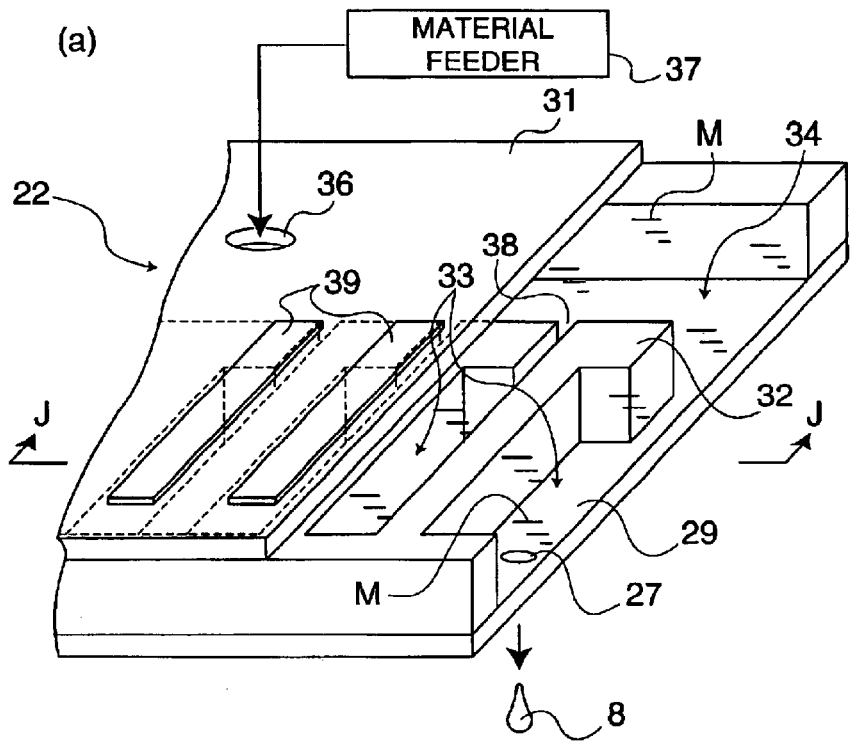
FIGS. 12(a) and 12(b) are schematics that show the inner structure of the head, where
Figure 12:
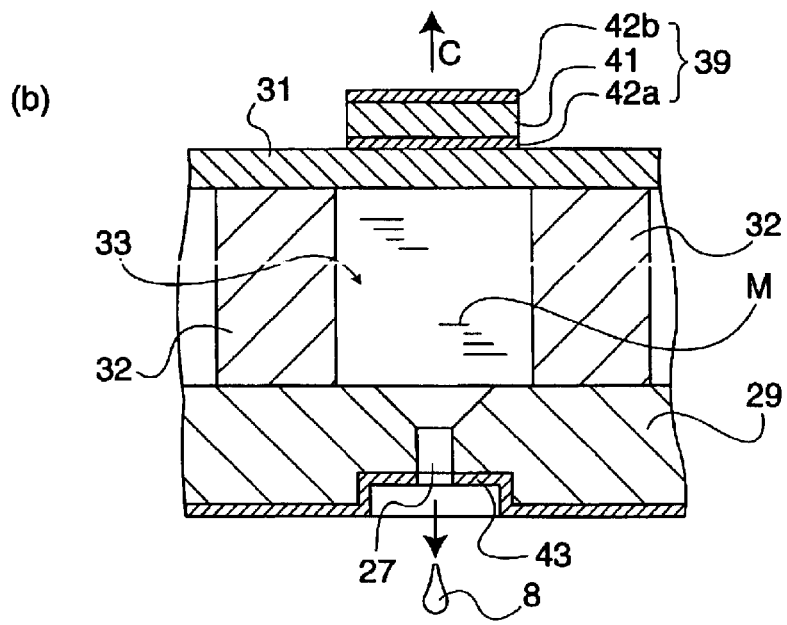

The head 22 includes a nozzle plate 29 composed of stainless steel, a vibration plate 31 facing thereto, and a plurality of partition members 32 to bond them with each other, as shown in FIGS. 12A and 12B. A plurality of material chambers 33 and fluid reservoirs 34 are formed by the partition members 32 between the nozzle plates 29 and vibration plates 31. Each material chamber 33 and fluid reservoir 34 are communicating with each other through a conduit 38.

A material feed port 36 is provided at an appropriate site on the vibration plate 31. A material feeder 37 is connected to the material feed port 36. The material feeder 37 supplies a material M including one of the colors R, G and B, for example the R color filter element material, to the material fed port 36. The material M fed as described above is filled in the fluid reservoir 34, and then filled in the material chamber 33 through the conduit 38.

The nozzle plate 29 includes the nozzle 27 to blow a jet of the material M from the material chamber 33, A material compressor 39 is attached on the back face of the material chamber 33 of the vibration plate 31 so as to correspond to the material chamber 33. As shown in FIG. 12(b), the material compressor 39 includes a piezoelectric element 41 and a pair of electrodes 42a and 42b with interposition of the piezoelectric element. The piezoelectric element 41 is deformed by bending so as to protrude out to the outside as shown by the arrow C by flowing an electric current through the electrodes 42a and 42b to increase the volume of the material chamber 33. Then, the material M corresponding to the increased volume flows into the material chamber 33 from the fluid reservoir 34 through the conduit 38.

When electric current to the piezoelectric element 41 is turned off, both the piezoelectric element 41 and vibration plate 31 return to their initial shapes to return the volume of the material chamber 33 to its original volume, and the pressure of the material M filled in the material chamber 33 increases to blow the material M out of the nozzle 27 as droplets 8. A repelling material layer 43 including, for example, a Ni-tetrafluoroethylene coprecipitation plating layer, is provided around the nozzle 27 to prevent or substantially prevent the droplets 8 from curved flight and the nozzle 27 from clogging.

The head position controller 17, substrate position controller 18, scanning driver 19 and feed driver 21, and other devices disposed around the head 22 will be described hereinafter with reference to FIG. 10. The head position controller 17 includes an $\alpha$-motor 44 to rotate the head 22 attached to a head unit 26 in a plane (in a horizontal plane), a $\beta$-motor 46 to permit the head 22 to perform oscillatory rotation around an axis line parallel to the feed direction Y, a $\gamma$-motor 47 for permitting the head 22 to perform oscillatory rotation around an axis line parallel to the scanning direction X, and a Z-motor 48 to permit the head 22 to move parallel to the ascending and descending directions.

The substrate position controller 18 includes a table 49 to mount the substrate 12, and a $\theta$-motor 51 to rotate the table 49 in a plane (horizontal plane). The scanning driver 19 includes an X-guide rail 52 extending in the scanning direction X, and an X-slider 53 integrating a pulse driven liner motor. The X-slider 53 performs a parallel movement in the scanning direction X along the X-guide rail 52 by actuating the integrated linear motor.

The feed driver 21 incudes a Y-guide rail 54 extending in the feed direction Y, and a Y-slider 56 integrating a pulse-driven linear motor. The Y-slider 56 performs a parallel movement in the feed direction Y along the y-guide rail 54 by actuating the integrated linear motor.

The pulse-driven linear motors in the X-slider 53 and Y-slider 56 permit the rotation angle of the output axis to be precisely controlled by pulse signals supplied to the motors. Accordingly, the position of the head 22 supported by the X-slider 53 on the scanning direction X, and the position of the table 49 on the feed direction Y may be controlled with high precision. Positional control of the head 22 and table 49 is not restricted to positional control using the pulse motor, and feedback control using a servo motor or any other arbitrary methods may be available.

Positioning pins 50a and 50b to regulate the planar position of the substrate 12 are mounted on the table 49. The substrate 12 is held with positioning by making the scanning direction X side and feed direction Y side face of the substrate to contact the positioning pins 50a and 50b, respectively, by the substrate feeder 23. A fixing device of the related art, such as an air sucking (vacuum adsorption) device, is desirably provided on the table 49 in order to secure the substrate 12 with positioning as described above.

Plural sets of imaging devices (two sets in the drawing) 91R and 91L, and 92R and 92L are disposed above the table 49 in the droplet discharge apparatus 16, as shown in FIG. 10. Only the lens barrels are shown in FIG. 10 with respect to the imaging devices 91R and 91L, and 92R and 92L, and other portions and supporting structures thereof are omitted.

A CCD camera may be used for the imaging device as an observation device. These imaging devices are omitted in FIG. 9.

The substrate feeder 23 shown in FIG. 9 includes a substrate container 57 housing the substrate 12, and a substrate conveyer 58, such as a robot, to convey the substrate 12. The substrate conveyer 58 includes a base table 59, an elevation axis 61 that permits ascending and descending movement relative to the base table 59, a first arm 62 rotating around elevation axis 61 as a center, a second arm 63 rotating relative to the first arm 62, and an adsorption pad 64 provided on the lower face at the tip of the second arm 63.

The adsorption pad 64 is so constructed as to be able to hold the substrate 12 by air suction (vacuum adsorption).

As shown in FIG. 9, a capping device 76 and a cleaner 77 are disposed under the scanning trail of the head 22 and at one side of the feed driver 21. An electronic balance 78 is disposed at the other side of the feed driver 21. The capping device 76 is provided in order to prevent or substantially prevent the nozzle 27 from being dried while the head 22 is in waiting (see FIG. 11). The cleaner 77 is provided to clean the head 22. The electronic balance 78 is provided to weigh the ink droplets 8 discharged from each nozzle 27 in the head 22 for every nozzle. A head camera 81 that moves in synchronize with the head 22 is further provided in the vicinity of the head 22.

The controller 24 shown in FIG. 9 includes a computer unit 66 integrating a processor, an input device 67, such as a keyboard, and a display 68, such as CRT. The computer unit 66 includes a CPU (central processing unit) 69 and a memory recording medium 71 as a memory to store various information shown in FIG. 13.

Figure 13:
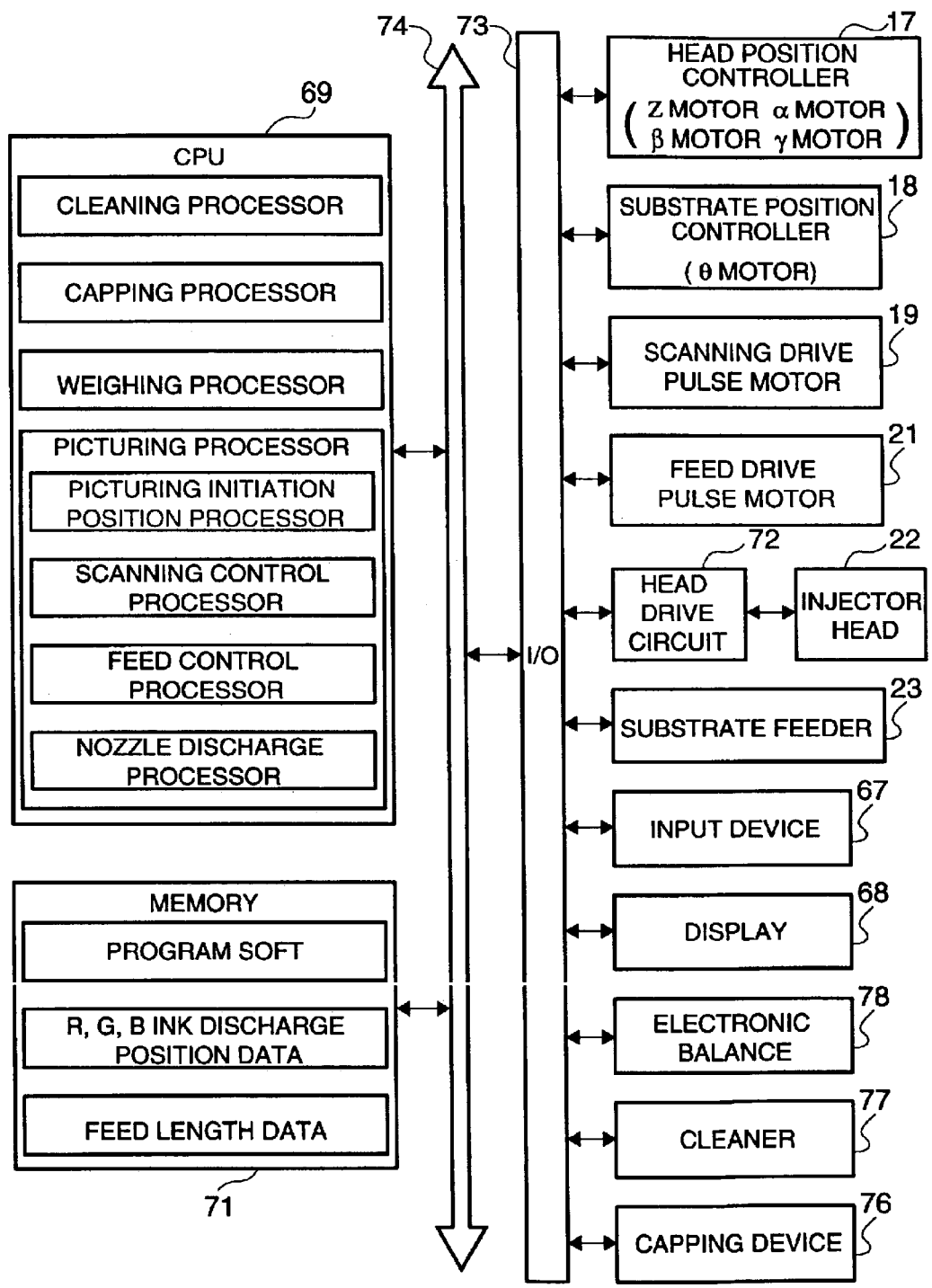
FIG. 13 is a schematic of an electric control system used for the droplet discharge apparatus.

The head position controller 17, substrate position controller 18, scanning driver 19, feed driver 21 and head driving circuit 72 to actuate the piezoelectric element 41 (see FIG. 12(b)) in the head 22 are connected to CPU 69 via an input-output interface 73 and a bas 74, as shown in FIG. 13. The substrate feeder 23, input-output device 67, display 68, capping apparatus 76, cleaner 77 and electronic balance 78 are also connected to CPU 69 via the input-output interface 73 and bas 74.

The memory as the information recording medium 71 includes semiconductor memories, such as RAM (random access memory) and ROM (read only memory), and external memories such as a hard disk, CD-ROM reader and disk type recording medium, and its functional part includes a memory region that stores a program soft describing the control procedure of the action of the droplet discharge device 16, a memory region to store positional data by which the head 22 discharges a material on the substrate 12, a memory region to store the feed distance of the substrate 12 in the feed direction Y as shown in FIG. 10, a region that functions as a work area and temporary file for CPU 69, and various memory regions.

CPU 69 is engaged in control of discharge of the material at a predetermined position on the surface of the substrate 12 in accordance with the program soft stored in the memory as the information recording medium 71. Practical functional parts include, as shown in FIG. 13, a cleaning processor to provide cleaning processing, a capping processor to provide capping processing, a weighing processor to provide weighing using the electronic balance 78, and a picturing processor to provide picturing with a prescribed pattern by impacting a material on the substrate 12 by discharging the droplets.

The picturing processor includes various processors, such as a picturing starting position processor to set the head 22 at an initial position to provide picturing, a scanning control processor to provide control to allow the head 22 to scan in the scanning direction X with a prescribed speed, a feed control processor to provide control to allow the substrate 12 to shift by a predetermined shift distance in the feed direction Y, and a nozzle discharge control processor to provide control to determine which of the nozzle in plural nozzles 27 in the head 22 is to be operated to discharge the material.

While each function as described above is performed by the program soft using CPU 69 in the embodiment above, an electronic circuit may be used provided that these functions are performed using the electronic circuit without using CPU.

Figure 14:
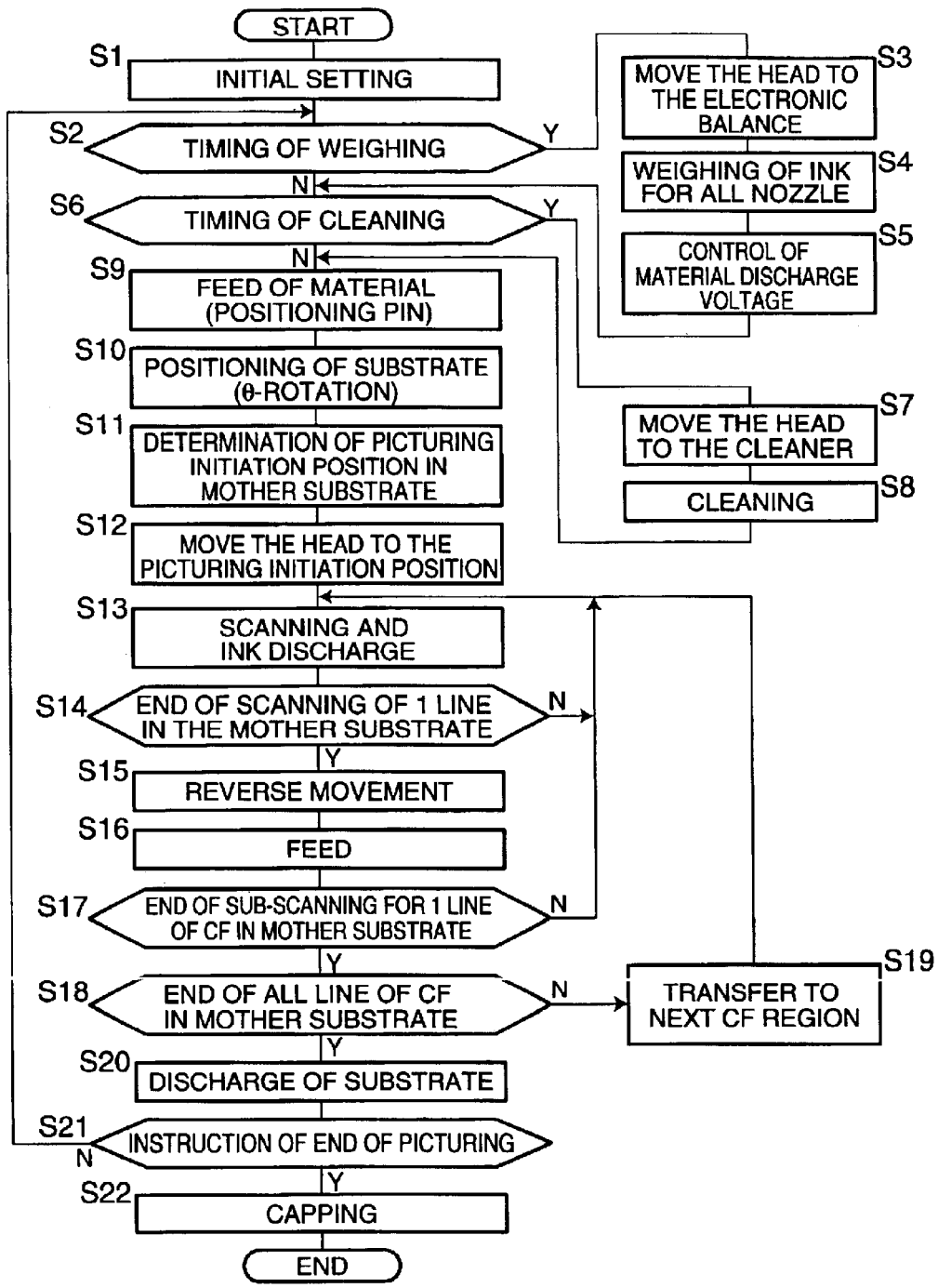
FIG. 14 is a flowchart showing the flow of control executed by the control system in FIG. 13.

The operation of the droplet discharge device 16 including the constitutions above will be described hereinafter with reference to the flowchart in FIG. 14. The droplet discharge device is put in an initial setting in step S1 when the operator turns the power source on to operate the droplet discharge device 16. Practically, the head unit 26, substrate feeder 23 and controller 24 are set in a predetermined initial state.

When the weighing timing is ready (step S2), the head unit 26 shown in FIG. 10 is allowed to move to the electronic balance 78 shown in FIG. 9 by the scanning driver 19 (step S3). Then, the amount of the material discharged from the nozzle 27 is weighed using the electronic balance 78 (step S4). Subsequently, the voltage to be applied to the piezoelectric element 41 on each nozzle 27 is adjusted in accordance with the material discharge characteristics of the nozzle 27 after weighing (step S5).

When the cleaning timing is ready (step S6), the head unit 26 is allowed to move to the cleaner 77 by the scanning driver 19 (step S7), and the head 22 is cleaned with the cleaner 77 (step S8).

When the weighing timing and cleaning timing are not ready, or weighing and cleaning are over, the substrate feeder 23 shown in FIG. 9 is operated in step S9 to feed the substrate 12 to the table 49. Practically, the substrate 12 in the substrate container 57 is held by adsorption with the adsorption pad 64, the substrate 12 is conveyed to the table 49 by moving the ascending and descending axis 61, the first arm 62 and second arm 63, and the substrate is compressed onto the positioning pins 50a and 50b (see FIG. 10) provided at appropriate sites on the table 49. It is desirable to fix the substrate 12 on the table 49 by air suction (vacuum adsorption), in order to prevent or substantially prevent shift of the position of the substrate 12 on the table 49.

The table 49 is allowed to rotate in a plane (horizontal plane) by rotating the output axis of the θ-motor 51 with a minute angle unit while observing the substrate 12 with the imaging devices 91R and 91L shown in FIG. 10 to position the substrate 12 (step S10). Practically, alignment marks formed at the right and left side ends of the substrate 12 are photographed with a pair of the imaging devices 91R and 91L, or 92R and 92L shown in FIG. 10, respectively, the planar posture of the substrate 12 is determined by processing the imaged positions of these alignment marks, and the table 49 is rotated depending on the planar posture to adjust the angle θ.

The position for starting to picture with the head 22 is determined by processing thereafter while observing the substrate 12 with the head camera 81 shown in FIG. 9 (step S11). Then, the head 22 is moved to the position to start to picture by appropriately operating the scanning driver 19 and feed driver 21 (step S12).

The head 22 may be constructed so that the reference direction S shown in FIG. 11 is aligned with the scanning direction X, or so that the reference direction S is inclined to the scanning direction with a given angle. This angle is determined so that the dimensional component of the pitch of the nozzle 27 aligned in the alignment direction T in the feed direction Y of the substrate 12 becomes geometrically equal to the pitch of the hit position in the feed direction Y when the head 22 moves in the scanning direction X, since pitch of the nozzle 27 is often different from the pitch of the position on which the material impacts the surface of the substrate 12.

After the head 22 is placed at the position to start to picture in the step S12 shown in FIG. 4, the head 22 linearly moves in the scanning direction X with a constant speed in the step S113. Droplets of the material is continuously discharged from the nozzle 27 of the head 22 onto the surface of the substrate 12 during this scanning period.

While the discharge volume of the droplets of the material may be adjusted so that all the material is discharged in the discharge range in which the head 22 is able to cover by one scanning, the discharge volume may be designed so that a fraction (for example one fourth) of the volume to be discharged by one scanning is discharged, and so that the scanning range partially overlaps with each other in the feed direction Y during several times of the scanning of the head 22. The material is discharged several times (for example four times) in the entire range.

The head 22 returns to its initial position (step S15) by inversion of the direction of movement after completing one line of scanning on the substrate 12 (step 14), and moves by a predetermined length (prescribed fed length) in the feed direction Y (step S16). The process returns to step S113 again to start discharge the material, and this process is repeated to scan along the plural lines. However, the head may move by a given distance in the feed direction Y after completing one line of scanning, and the direction of scanning is reversed to alternatively reverse the scanning direction.

When plural color filters are formed on the substrate 12 as will be described hereinafter, the head 22 moves by a given distance in the feed direction Y after all the ink has been discharged for one line of the color filter region on the substrate 12 (step S117), and the operations from step S13 through step S16 are repeated as described above. The substrate 12 after processing is discharged in step S20 by the substrate feeder 23 or other conveyers when discharge of the material has been completed throughout all lines of the color filter region on the substrate 12. Feed of the substrate 12 and discharge of the material are repeated thereafter until the operator gives an instruction of end of the work.

CPU 69 instructs the head 22 to move to the capping device 76 as shown in FIG. 9 based on the instruction of end of the work by the operator (step S21), and the head 22 is capped by the capping device 76 (step S22).

[Manufacturing Method of Display (Electrooptical Device)]

The embodiment on the method for manufacturing the display (electrooptical device) according to the present invention will be described hereinafter.

Figure 15:
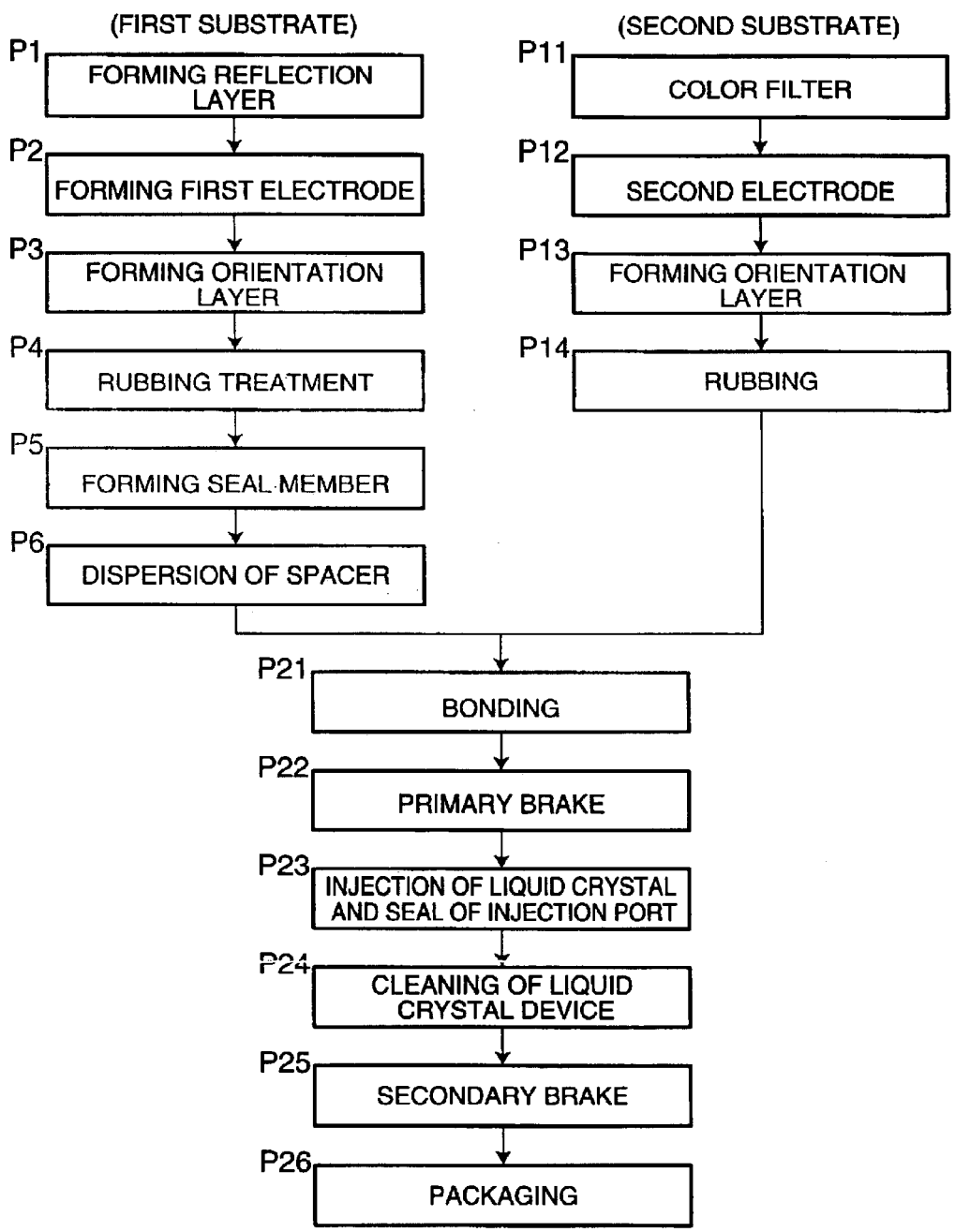
FIG. 15 is a flowchart showing one embodiment of the method for manufacturing the display device (liquid crystal device) according to the present invention.
Figure 16:
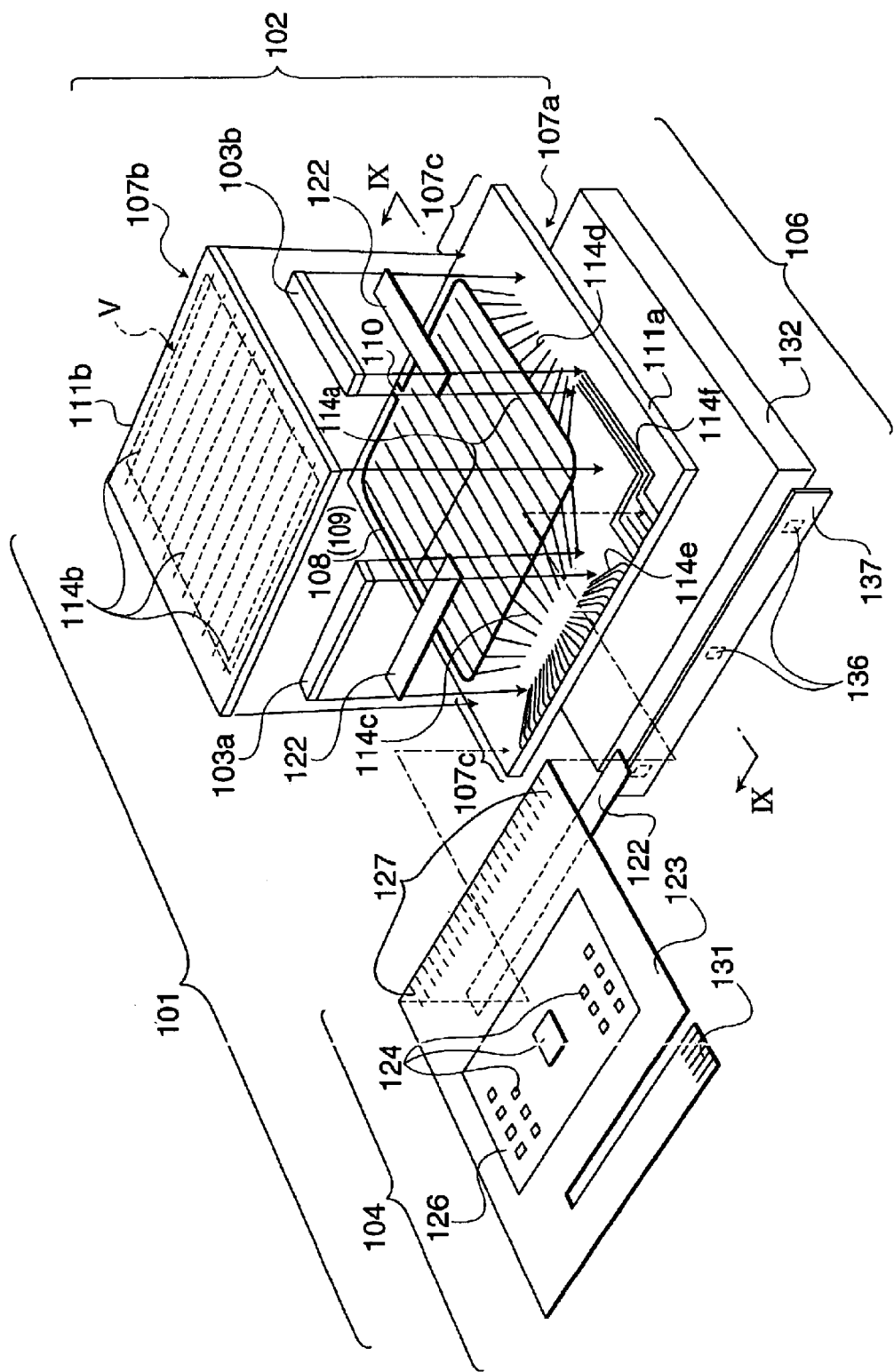
FIG. 16 is an exploded perspective view showing one example of the liquid crystal device manufactured by the method for manufacturing the display device (liquid crystal device) according to the present invention.
Figure 17:
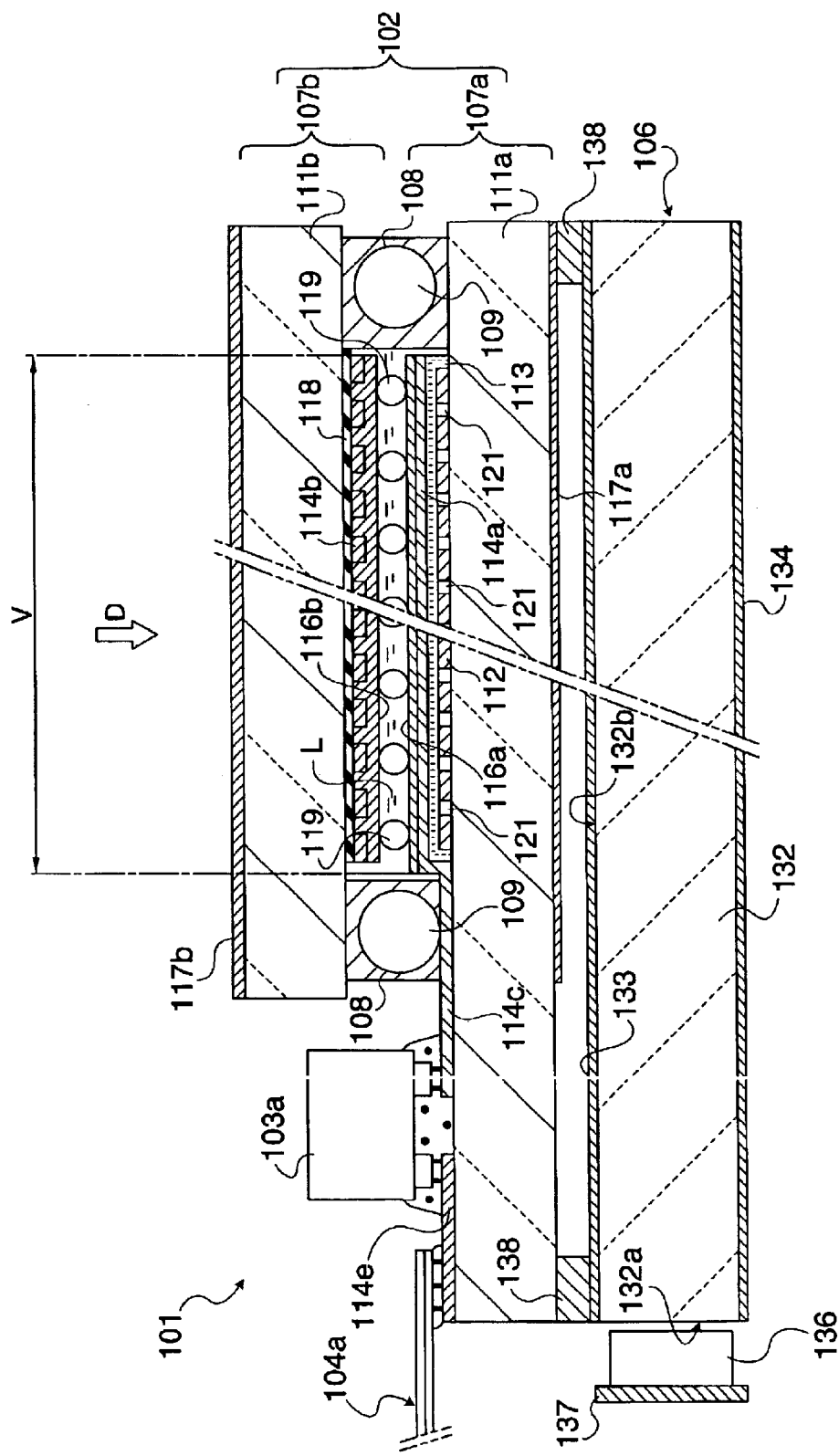
FIG. 17 is a cross-sectional view of the liquid crystal device taken along plane IX—IX in FIG. 16.

FIG. 15 is a flowchart that shows the method for manufacturing the liquid crystal device as one example of the method for manufacturing the display (electrooptical device) according to the present invention. FIG. 16 is a perspective view that shows one embodiment of the liquid crystal device as one example of the display (electrooptical device) manufactured by the manufacturing method. FIG. 17 is a cross-sectional view of the liquid crystal device along plane IX—IX in FIG. 16 is a perspective view that. One example of the structure of the liquid crystal device will be described at first with reference to FIGS. 16 and 17. The liquid crystal device is one example of the passive matrix type full color transfelctive display liquid crystal device.

As shown in FIG. 16, a liquid crystal addressing ICs 103a and 103b constructed as semiconductor chips are mounted on the liquid crystal panel 102 in the liquid crystal device 101, and FPC (flexible printed circuit) as a wiring connection element 104 is connected to the liquid crystal panel 102. An illumination device 106 as a backlight is provided on the back face of the liquid crystal panel 102.

The liquid crystal panel 102 is formed by bonding the first substrate 107a and second substrate 107b with a seal member 108. The seal member 108 is formed, for example, by adhering an epoxy resin on the inner surface of the first substrate 107a or second substrate 107b as a ring (annular circumference) by screen printing. Electrical communication materials 109 formed into spherical or cylindrical shape with a conductive material are dispersed within the seal member 108 as shown in FIG. 17.

As shown in FIG. 17, the first substrate 107a includes a sheet of base material 111a made of a transparent glass or plastic. A reflection layer 112 is formed on the inner surface (the upper side surface in FIG. 17) of the base material 111a. An insulation layer 113 is laminated thereon, and a first electrode 114a is formed as stripes (see FIG. 16) as viewed from the direction of the arrow D on the insulation layer. An orientation layer 116a is formed on the first electrode. A polarizer 117a is attached on the outer surface (the lower surface in FIG. 17) of the base material 111a by bonding.

In FIG. 16, the space between the first electrodes is drawn to be larger than the actual space for easy recognition of the arrangement of the first electrodes 114a. Accordingly, a larger number of the first electrodes 114a than the number of the first electrodes 114a shown in FIG. 16 are actually formed on the base material 111.

As shown in FIG. 17, the second electrode 107b includes a sheet of base material 111b formed of a transparent glass or plastic. The color filter 118 is formed on the inner surface (the lower side surface in FIG. 17) of the base material 111b, and second electrodes 114b are formed on the color filter in the direction perpendicular to the first electrode 114a as stripes as viewed from the direction of the arrow D (see FIG. 16). An orientation layer 116b is formed on the second electrode. A polarizer 117b is attached on the outer surface of the base material 111b (upper surface in FIG. 17) by bonding.

The space between the second electrodes is drawn to be larger than the actual space for easy recognition of the arrangement of the second electrodes 114b. Accordingly, a larger number of the second electrodes 114b than the number of the second electrodes 114b shown on the drawing are actually formed on the base material 111.

As shown in FIG. 17, an STN (super twist nematic) liquid crystal L is sealed in the region surrounded by the first substrate 107a, second substrate 107b and seal member 108, or in the so-called cell gap. A lot of fine and spherical spacers 119 are dispersed on the inner surface of the first substrate 107a or second substrate 107b, and the cell gap is maintained to be uniform by the presence of the spacers 119 in the cell gap.

The first electrode 114a and second electrode 114b are disposed by being elongated so as to be perpendicular with each other. The cross points among them are arranged as a dot matrix as viewed from the direction of arrow D in FIG. 17. Each cross point of the dot matrix constitutes one display dot. The color filter 118 is constructed by arranging each color element of R (red), G (green) and B (blue) colors in a pattern, such as a striped arrangement, delta arrangement and mosaic arrangement. One display dot corresponds to each one of the R, G and B colors. One pixel includes the display dots of three colors of R, G and B.

Images, such as letters and numerals, are displayed at the outside of the second substrate 107b of the liquid crystal panel 102 by selectively turning on the dots arranged in a matrix. The region where the image is displayed as described above corresponds to an effective display region, which is indicated by the arrow V in FIGS. 16 and 17.

As shown in FIG. 17, the reflection layer 112 is formed of a light reflection material, such as an APC alloy and aluminum. An aperture 121 is formed at a position corresponding to each display dot as the cross points between the first electrode 114a and second electrode 114b. Accordingly, the apertures 121 are arranged as a matrix as the display dots are as viewed from the arrow D in FIG. 17.

The first and second electrodes 114a and 114b are made of, for example, ITO (indium tin oxide) as a transparent conductive material. The orientation layers 116a and 116b are formed by depositing a polyimide resin with a uniform thickness. The initial orientation direction of the liquid crystal molecules on the surfaces of the first and second substrates 107a and 107b by applying a rubbing treatment on the orientation films 116a and 116b.

As shown in FIG. 16, the first substrate 107a is formed to be wider than the second substrate 107b, and the first substrate 107a includes an expanded substrate region 107c expanding out of the second substrate 107b when the substrates are bonded with the seal member 108. Various wiring lines such as a pull-out wiring line 114c extending from the first electrode 114a, a pull-out wiring line 114d in electrical continuity with the second electrode 114b on the second substrate 107b via the electrical communication materials 109 (see FIG. 17) formed within the seal member 108, an input bump of the liquid crystal addressing IC 103a, or a metal wiring line 114e connected to input terminal, and a metal wiring line 114f connected to an input bump of the liquid crystal addressing IC 103b are formed on the expanded substrate region 107c as a prescribed pattern.

The pull-out wiring line 114c extending from the first electrode 114a, and the pull-out wiring line 114d in electrical continuity with the second electrode 114b are formed of ITO that is the same material as the materials of these electrodes. The wiring lines 114e and 114f as the input side wiring lines of the liquid crystal addressing ICs 103a and 103b, respectively, are formed of a metal material having low resistivity, for example the APC alloy. The APC alloy mainly includes Ag with addition of Pd and Cu with a composition ratio of, for example, 98% by weight of Ag, 1% by weight of Pd and 1% by weight of Cu.

The liquid crystal addressing ICs 103a and 103b are packaged by being bonded on the surface of the expanded substrate region 107c with an ACF (anisotropic conductive film) 122. In other words, in this embodiment, it is formed by directly packaging the semiconductor chip on the substrate as a so-called COG (chip-on-glass) type liquid crystal panel. The input side bumps of the liquid crystal addressing ICs 103a and 103b are electrically connected to the metal wiring lines 114e and 114f, respectively, and the output side bumps of the liquid crystal addressing ICs 103a and 103b are electrically connected to the pull-out wiring lines 114c and 114d, respectively, in this COG type packaging through conductive particles contained within the ACF 122.

In FIG. 16, FPC 104 includes a flexible resin film 123, a circuit 126 formed including chip members 124, and a metallic wiring terminals 127. The circuit 126 is directly mounted on the surface of the resin film 123 by a conductive connection method, such as soldering. The metallic wiring terminal 127 is formed of an APC alloy, Cr, Cu and other conductive materials. The portion of the FPC 104 where the metallic wiring terminals 127 are formed is connected to the portion of the first substrate 107a where the metal wiring lines 114e and 114f are formed with ACF 122. The metal wiring lines 114e and 114f at the substrate side are electrically connected to the metal wiring line 127 at the FPC side with the conductive particles contained in ACF 122.

External connection terminals 131 are formed at the edge at the opposed side of the FPC 104, and this external connection terminals 131 are connected to auxiliary circuits (not shown). The liquid crystal addressing ICs 103a and 103b are addressed based on signals transferred from the auxiliary circuits, scanning signals are supplied to one of the first and second electrodes 114a and 114b, and data signals are supplied to the other electrode. Voltages of the display dots arranged within the effective display region V are independently controlled by these signals, and orientation of the liquid crystal L in each dot is independently controlled.

The illumination device 106 shown in FIG. 16 incudes a light guide 132 composed of an acrylic resin, a diffusion sheet 133 provided on the light projection face 132b of the light guide 132, a reflection sheet 134 provided at the opposed side to the light projection face 132b of the light guide 132, and an LED (light emitting diode) 136 as a light source, as shown in FIG. 17.

The LED 136 is supported by an LED substrate 137, which is attached to a supporting member (not shown) integrally formed with the light guide 132. The LED 136 is placed at a position opposed to a light import face 132a as a side face of the light guide 132 by attaching the LED substrate 137 at a prescribed position of the supporting member. The reference numeral 138 denotes a buffer member to moderate the impact applied on the liquid crystal panel 102.

The light emitted from the LED 136 is imported from the light import face 132a, guided to the inside of the light guide 132, and is projected out as a planar light through the diffusion sheet 133 from the light projection face 132b after propagating by being reflected on the wall surface of the reflection sheet 134 and light guide 132.

The liquid crystal device 101 imports an external light from the second substrate 107b side into the liquid crystal panel 102 as shown in FIG. 17 when the external light, such as sunlight and room light, is sufficiently bright, and light after passing through the liquid crystal L is supplied to the liquid crystal L by being reflected with the reflection layer 112. The liquid crystal L is controlled by being oriented with respect to each of the R, G and B display dots by the electrodes 114a and 114b interposing the liquid crystal L. Accordingly, the light supplied to the liquid crystal L is modulated for each display dot to separate the light into permeable light and impermeable light against the polarizing plate 117b, and images, such as letters and numerals, are displayed in reflection modes at the outside of the liquid crystal panel 102.

When sufficient intensity of external light cannot be obtained, on the other hand, the LED 136 emits a light to project the light out of the light projection face 132*b* of the light guide 132, and the light is supplied to the liquid crystal L through the aperture 121 formed on the reflection layer 112. The supplied light is modulated for each display dot by the orientation controlled liquid crystal L as in the case of reflection mode display. Consequently, the image is displayed to the outside to effect transmission mode display.

The liquid crystal device 101 having the construction as described above is manufactured, for example, by the manufacturing method, as shown in FIG. 15. A series of the steps P1 to P6 correspond to the steps for forming the first substrate 107*a*, and a series of the steps P11 to P114 correspond to the steps for forming the second substrate 107*b*. The steps for forming the first and second substrates are independently performed with each other.

In the first step for forming the first substrate, a refection layer 112 corresponding to plural liquid crystal panels 102 are formed by photolithography on the surface a large area mother substrate made of a transparent glass or plastic, followed by forming an insulation layer 113 thereon by a related art film deposition method (step P1). Subsequently, the first electrode 114*a*, pull-out wiring lines 114*c* and 114*d*, and metallic wiring lines 114*e* and 114*f* are formed by photolithography (step P2).

The orientation layer 116*a* is formed on the first electrode 114*a* thereafter by coating or printing (step P3), and the initial orientation of the liquid crystal is determined by applying a rubbing treatment to the orientation layer 116*a* (step P4). Then, an annular seal member 108 is formed by screen printing (step P5), and spherical spacers 119 are dispersed thereon (step P6). The large area mother first substrate includes several pieces of panel patterns formed on the first substrate 107*a* of the liquid crystal panel 102.

The steps for forming the second substrate (steps P11 to P14 in FIG. 15) are executed independently from the steps for forming the first substrate. A large area mother substrate made of a transparent glass or plastic is prepared, and color filters 118 corresponding to several pieces of the liquid crystal panel 102 are formed on the surface of the mother substrate (step P11). The color filters 118 are formed by the method shown in FIGS. 1A–1G and 3, and the R, G and B filter elements are formed by discharging droplets as the material of the filter element from the nozzle 27 of the head 22 using the droplet discharge apparatus 16 shown in FIG. 9. The method for manufacturing the color filter and the method for controlling the head 22 are omitted herein since they are the same as those that have been already described.

After forming the color filter 118 on the mother substrate 12, or mother substrate material, the second electrode 114*b* is formed thereon by photolithography (step P12). Then, the orientation layer 116*b* is formed by coating or printing (step P13). Subsequently, the orientation layer 116*b* is subjected to a rubbing treatment to determine the initial orientation of the liquid crystal (step P14). The large area mother second substrate including plural panel patterns on the second substrate 107*b* of the liquid crystal panel 102 is formed by the steps as described above.

After forming the large area mother first and second substrates, the seal member 108 is placed between the mother substrates, and the mother substrates are bonded to the seal member after alignment or positioning (step P21), thereby forming a vacant panel structure including several panel fractions with no sealed liquid crystal.

Scribe ditches, or partition ditches, are formed at prescribed positions of the vacant panel structure completed, and the substrate is divided by breaking by adding a stress or heat, or by irradiating a light, to the panel structure using the scribe ditches as references (step P22). Tablets of the vacant panels having an exposed liquid crystal injection port 110 (see FIG. 16) on the seal member 108 of each liquid crystal panel are manufactured.

The liquid crystal L is injected into each liquid crystal panel through the exposed liquid crystal injection port 110, and the port 110 is sealed with a resin (step P23). Usually, the inside of the liquid crystal panel is evacuated for injection of the liquid crystal, and the liquid crystal is injected by a differential pressure between the inside and outside of the liquid crystal panel. For example, the liquid crystal is reserved in a reservoir, and the reservoir storing the liquid crystal and tablet shaped vacant panel are placed in a chamber. The tablet shaped vacant panel is immersed in the liquid crystal in the chamber after evacuating the chamber. When the chamber is open to the atmosphere again, the liquid crystal compressed by the atmospheric pressure is introduced into the panel through the liquid crystal injection port, since the inside of the vacant panel is still evacuated. Since the liquid crystal adheres around the liquid crystal panel structure after injecting the liquid crystal, the tablet shaped panel after injection of the liquid crystal is cleaned in the step P24.

Scribe ditches are formed again at predetermined positions on the tablet shape panel after completing injection of the liquid crystal and cleaning. The tablet shaped panel is further divided with reference to the scribe ditches, thereby cutting the tablet into plural liquid crystal panels 102 (step P25). The liquid crystal addressing ICs 103*a* and 103*b* are mounted on respective liquid crystal panels manufactured as described above as shown in FIG. 16, the illumination device 106 is attached as a backlight, and FPC 104 is connected to each liquid crystal panel, thereby completing the desired liquid crystal device 101 (step P26).

The individual filter elements 3 are not always required to be formed by one scanning of the head 22, and they may be formed into a prescribed thickness by repeatedly receiving the discharged material by plural times (N times, for example four times) of scanning. The plural filter elements 3 are prevented or substantially prevented from having irregular thickness with each other even when the amounts of discharge of the material are not constant among plural nozzles 27, and stripes of irregular colors may be amended to enable the light transmission characteristics of the color filter to be uniform in the plane.

Since the filter element 3 is formed by discharging the material using the head 22 by using the droplet discharge apparatus 16 shown in FIG. 9 in the liquid crystal device and the manufacturing method thereof according to this embodiment, complicated manufacturing steps using photolithography is not needed with no waste of the material.

While the liquid crystal device including the liquid crystal panel has been described as the display in this embodiment, the present invention may be applied for other electrooptical devices providing the color filter same as described above, such as an EL device and plasma display panel. In the case of the EL device, the same effect as described in the foregoing embodiments may be obtained by piling the color filters providing the filter elements corresponding to plural display dots having an electroluminescent function on a plane.

The method for eliminating the materials, the method for reclaiming the base material and the method for manufacturing the display, and the electronic appliance including the display manufactured by the method for manufacturing thereof are not restricted to the examples in the drawings, and various modifications are possible within the scope not departing from the spirit of the present invention. For example, the base materials of the present invention are not restricted to the color filter substrate and EL panel, and they may construct a part or main part of the various displays, such as a liquid crystal panel, fluorescent panel and plasma display panel. The display according to the present invention may be applied not only for the various electrooptic devices other than the liquid crystal device and EL device, but also for various devices such as CRT.

Figure 18:
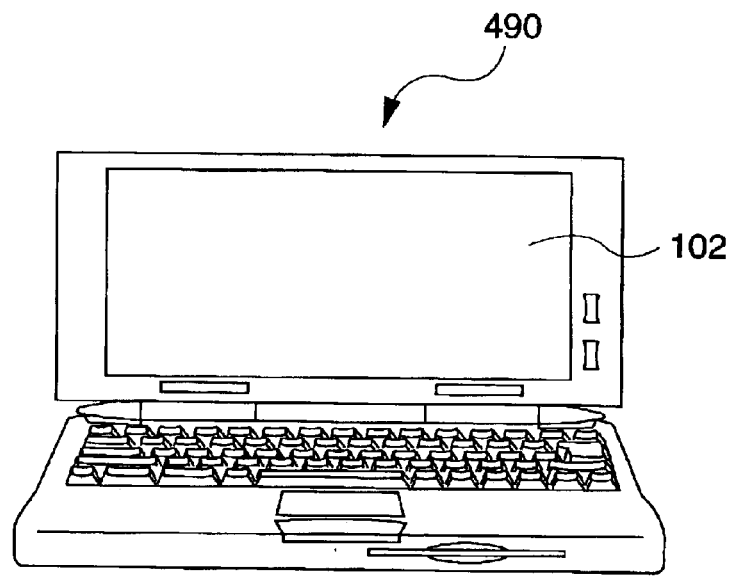
FIG. 18 is a perspective view showing a personal computer as an exemplary electronic appliance that includes the display.
Figure 19:
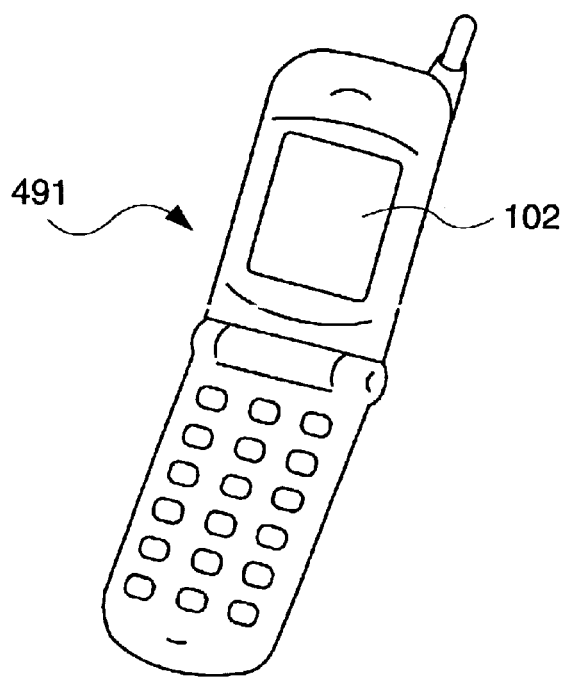
FIG. 19 is a perspective view showing a cellular phone as an exemplary electronic appliance that includes the display.

Examples of electronic appliances in which the display (electrooptical device) in each embodiment is integrated are not restricted to the personal computer 490 as shown in FIG. 18, and examples thereof include various electronic appliances including portable phones, such as cellular phones 491 and PHS (personal handy phone system) as shown in FIG. 19, an electronic notebook, a pager, a POS (point of sales) terminal, an IC card, a mini-disk player, a liquid crystal projector, an engineering workstation (EWS), a word processor, a television, a viewer finder type or face-up monitor type video tape recorder, an electronic desktop calculator, a car navigation system, a touch-panel device, an watch, and a game machine, for example.

Although only the examples of the display have been described in the specification, the method for eliminating the material and the method for reclaiming the material according to the present invention may be applied for devices other than the display. For example, these methods may be employed for a manufacturing process for forming metal wiring lines by discharging liquid metals and conductive materials for forming electric wiring lines on the substrate, a manufacturing process for forming a minute micro-lens, a process for coating a resist on a required site of the substrate, a manufacturing process for forming hills and minute white patterns for scattering a light on a transparent substrate, a manufacturing process for forming fluorescence labeled probes by discharging RNA (ribonucleic acid) on a matrix of spike spots on a DNA (deoxyribonucleic acid) chip, and a process for forming a bio-chip by discharging a sample, antibody and DNA (deoxyribonucleic acid) on dots divided on the substrate, for example.

[Advantages]

According to the present invention, a material can be disposed again on the region divided by partition walls left behind on the substrate by eliminating the material (display element) while leaving the partition walls behind when defects are found on the material (display element). Consequently, the production efficiency can be further enhanced with a decreased amount of waste, since the partition walls are not required to be reconstructed on the base material.

What is claimed is:

1. A method for eliminating a material disposed on a region divided by partition walls formed on a base, comprising:
   eliminating the material while the partition walls remain on the base.

2. The method for eliminating the material according to claim 1,
   further including forming the partition walls by exposing a radiation sensitive material to radiation and by developing the exposed material, and
   peeling the material off or dissolving the material by a development substance that is capable of being used for development.

3. The method for eliminating the material according to claim 2, further including applying vibration or stress to peel off or dissolve the material.

4. The method for eliminating the material according to claim 1, further including forming the material by introducing a liquid material into a region divided by the partition walls.

5. The method for eliminating the material according to claim 4, further including eliminating the material as a material before solidification.

6. The method for eliminating the material according to claim 1, the material being a filter element constituting a color filter.

7. The method for eliminating the material according to claim 1, the material being an EL substance.

8. A method for reclaiming a base, comprising:
   the method for eliminating a material disposed on a region divided by partition walls formed on the base; and
   subsequently forming a material on the base.

9. A method for manufacturing a display, comprising:
   forming partition walls on a base;
   introducing a display element in a region divided by the partition walls to form the base;
   inspecting the base;
   detecting a defective display element, while eliminating the display element, and while the partition wall remains on the base; and
   eliminating the defective display element; and
   subsequently disposing another display element again in the region divided by the partition wall.

10. The method for manufacturing the display according to claim 9,
    the forming partition walls including forming the partition wall by irradiating a radiation to a radiation sensitive material and by developing the irradiated material; and
    the eliminating including peeling the display element off or dissolving the display element by a development substance that is capable of being used for development.

11. The method for manufacturing the display according to claim 10, further including applying vibration or stress to the display element for peeling off or dissolving the display element.

12. The method for manufacturing the display according to claim 9, the introducing a display element including introducing a liquid material as the display element in the region divided by the partition wall.

13. The method for manufacturing the display according to claim 12, further comprising;
    solidifying the display element when no defective display element has been detected; and
    the eliminating the display element including eliminating the display element before solidification.

14. The method for manufacturing the display according to claim 9, the display element being a filter element constituting a color filter.

15. The method for manufacturing the display according to claim 9, the display element being an EL substance.

16. An electronic appliance, comprising:
    a display manufactured by the manufacturing method according to claim 9.

* * * * *